United States Patent
Ferrie et al.

(10) Patent No.: US 8,845,131 B2
(45) Date of Patent: Sep. 30, 2014

(54) ANGLED LIGHT BOX LIGHTING SYSTEM

(75) Inventors: Timothy Drew Ferrie, Ojai, CA (US); Aaron Meyer, Ventura, CA (US); Bruce Quaal, Ventura, CA (US)

(73) Assignee: The Sloan Company, Inc., Ventura, CA (US)

( * ) Notice: Subject to any disclaimer, the term of this patent is extended or adjusted under 35 U.S.C. 154(b) by 200 days.

(21) Appl. No.: 13/409,064

(22) Filed: Feb. 29, 2012

(65) Prior Publication Data

US 2013/0058090 A1 Mar. 7, 2013

Related U.S. Application Data

(63) Continuation-in-part of application No. 13/010,413, filed on Jan. 20, 2011, and a continuation-in-part of application No. 13/010,703, filed on Jan. 20, 2011, and a continuation-in-part of application No. 12/316,411, filed on Dec. 12, 2008.

(60) Provisional application No. 61/297,681, filed on Jan. 22, 2010, provisional application No. 61/425,713, filed on Dec. 21, 2010, provisional application No. 61/448,131, filed on Mar. 1, 2011.

(51) Int. Cl.
| | |
|---|---|
| *F21V 21/00* | (2006.01) |
| *F21V 29/00* | (2006.01) |
| *G09F 13/04* | (2006.01) |
| *F21V 21/08* | (2006.01) |
| *F21V 3/04* | (2006.01) |
| *F21V 8/00* | (2006.01) |
| *F21S 4/00* | (2006.01) |
| *F21K 99/00* | (2010.01) |
| *F21Y 101/02* | (2006.01) |

(52) U.S. Cl.
CPC ................. *F21V 3/04* (2013.01); *G02B 6/0068* (2013.01); *F21S 4/003* (2013.01); *F21K 9/00* (2013.01); *G02B 6/0083* (2013.01); *G02B 6/0073* (2013.01); *G09F 13/0409* (2013.01); *F21Y 2101/02* (2013.01); *F21V 21/0808* (2013.01); *G02B 6/009* (2013.01)
USPC ....................................... 362/249.02; 362/294

(58) Field of Classification Search
CPC .... F21V 21/005; F21V 29/004; F21V 29/246
USPC .......................... 362/249.02, 249.04, 294, 362
See application file for complete search history.

(56) References Cited

U.S. PATENT DOCUMENTS

| | | | |
|---|---|---|---|
| 5,697,175 A | 12/1997 | Schwartz | |
| 6,042,248 A | 3/2000 | Hannah et al. | |

(Continued)

FOREIGN PATENT DOCUMENTS

| | | |
|---|---|---|
| JP | 2007073723 | 3/2007 |
| WO | WO 2008045415 A1 | 4/2008 |

(Continued)

OTHER PUBLICATIONS

GE Lighting Solutions, Tetra® Powerstrip and Powerstrip DS, technical data sheet and installation guide. 4 pages each.

(Continued)

*Primary Examiner* — David V Bruce
(74) *Attorney, Agent, or Firm* — Koppel, Patrick, Heybl & Philpott

(57) ABSTRACT

A lighting system comprising a light box housing, a plurality of lighting units including a housing, a plurality of light emitting elements mounted on a PCB within the housing. The light emitting elements arranged on an angled surface such that the light emitting elements emit light in a sideways direction from the lighting units. The lighting units can also be interconnected in a daisy-chain configuration, such that the lighting units form a row of lighting units. The row of lighting units adapted to be mounted within the light box housing, wherein the light box housing comprises one or more rows of lighting units.

65 Claims, 15 Drawing Sheets

(56) References Cited

U.S. PATENT DOCUMENTS

| | | | |
|---|---|---|---|
| 6,283,612 B1 | 9/2001 | Hunter | |
| 6,394,626 B1 | 5/2002 | McColloch | |
| 6,871,993 B2 * | 3/2005 | Hecht | 362/555 |
| 6,932,495 B2 | 8/2005 | Sloan et al. | |
| 7,063,440 B2 | 6/2006 | Mohacsi et al. | |
| 7,241,031 B2 | 7/2007 | Sloan et al. | |
| 7,513,639 B2 * | 4/2009 | Wang | 362/218 |
| 7,926,976 B2 | 4/2011 | Schinzel-Kolb et al. | |
| 2003/0063463 A1 | 4/2003 | Sloan et al. | 362/238 |
| 2004/0196636 A1 | 10/2004 | Kim | 361/736 |
| 2005/0195602 A1 | 9/2005 | Pan | 362/245 |
| 2005/0231943 A1 | 10/2005 | Sloan et al. | |
| 2005/0265019 A1 | 12/2005 | Sommers et al. | |
| 2008/0080184 A1 | 4/2008 | Cao | 362/252 |
| 2008/0094824 A1 * | 4/2008 | Stack et al. | 362/125 |
| 2008/0285264 A1 | 11/2008 | Whitehouse et al. | |
| 2008/0310156 A1 | 12/2008 | Wang | 362/231 |
| 2009/0226656 A1 | 9/2009 | Crandell et al. | |
| 2010/0135024 A1 | 6/2010 | Gier et al. | |
| 2010/0157595 A1 | 6/2010 | Lin et al. | |
| 2011/0164407 A1 | 7/2011 | Stack et al. | |
| 2013/0039063 A1 | 2/2013 | Quaal et al. | |

FOREIGN PATENT DOCUMENTS

| | | |
|---|---|---|
| WO | WO 2008100894 A1 | 8/2008 |
| WO | 2010024507 | 3/2010 |
| WO | 2011033551 | 3/2011 |
| WO | 2011055973 | 5/2011 |
| WO | 2012119002 | 7/2012 |

OTHER PUBLICATIONS

US LED, Tandum2 brochure and specification, 11 pages.
LumiLEDs, Inc. Red Super Flux LED Rail, data sheet, HLCR-KR99-R0100, HLCR-KR99-R0200, pp. 1-4.
"US LED: Tandem Cabinet Lighting, Tandem, Overview" http://www.usled.com/web10/products/cabinet/tandem/tandem.htm.
"Turnkey Plastic Injection Molding Services. Overmolding", Kamek Precision Tools, Inc., pp. 1-5. http://www.kamek.com/Overmolding/Default.aspx.
Tetra(tm) Mini Brings Bright Light to Small Signage Applications. GE Consumer Products. Aug. 18, 2010. pp. 1-4, http://pressroom.geconsumerproducts.com/pr/ge/06_tetramini.aspx.
Response to Office Action from corresponding U.S. Appl. No. 12/316,411, dated May 16, 2012.
Office Action from corresponding U.S. Appl. No. 12/316,411, dated Feb. 17, 2012.
Response to Office Action from corresponding U.S. Appl. No. 12/316,411, dated Dec. 19, 2011.
Office Action from corresponding U.S. Appl. No. 12/316,411, dated Sep. 19, 2011.
Response to Office Action from corresponding U.S. Appl. No. 12/316,411, dated Sep. 6, 2011.
Office Action from corresponding U.S. Appl. No. 12/316,411, dated Aug. 8, 2011.
PCT Notification of the International Search Report and the Written Opinion of the International Searching Authority. Dated Dec. 5, 2012: for International Application No. PCT/US2012/027336.
Invitation to Pay Additional Fee from PCT/US2014/020888, dated Jul. 16, 2014.

* cited by examiner

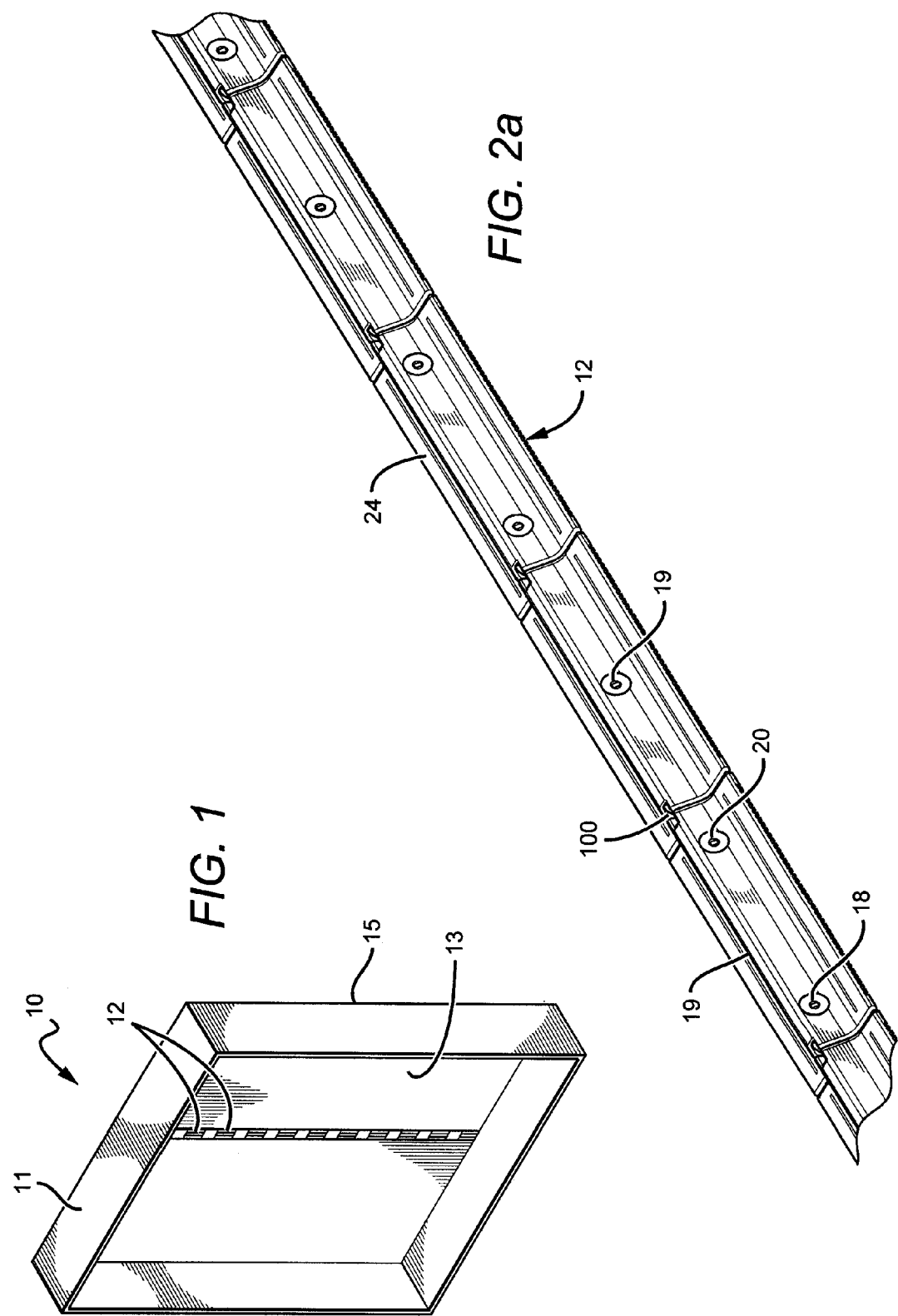

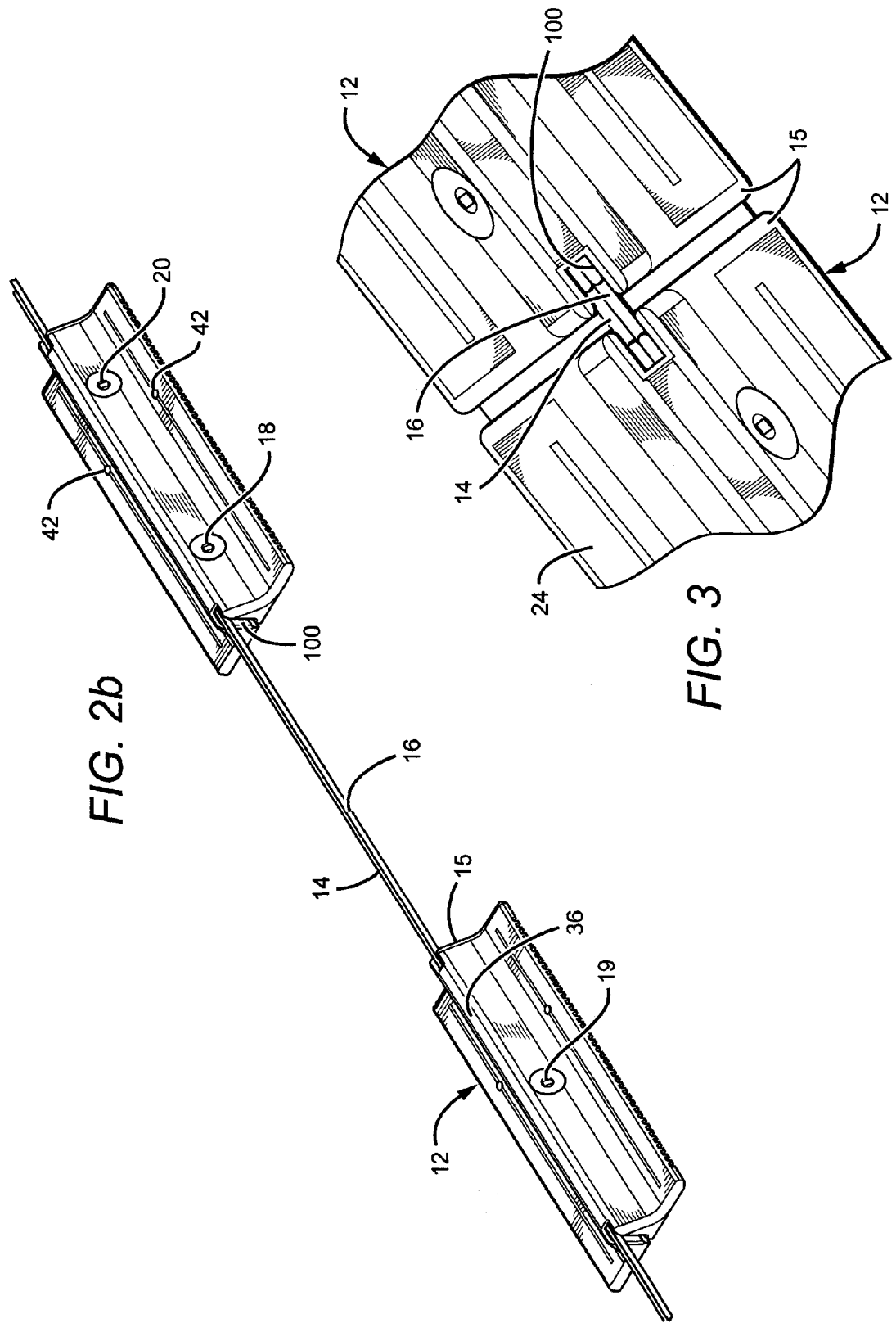

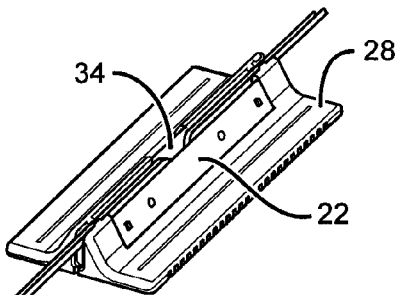
FIG. 6
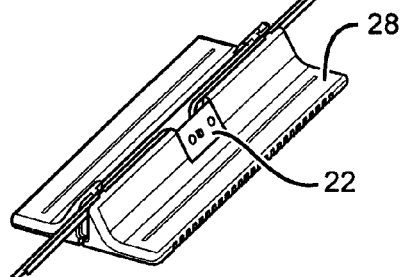
FIG. 7a
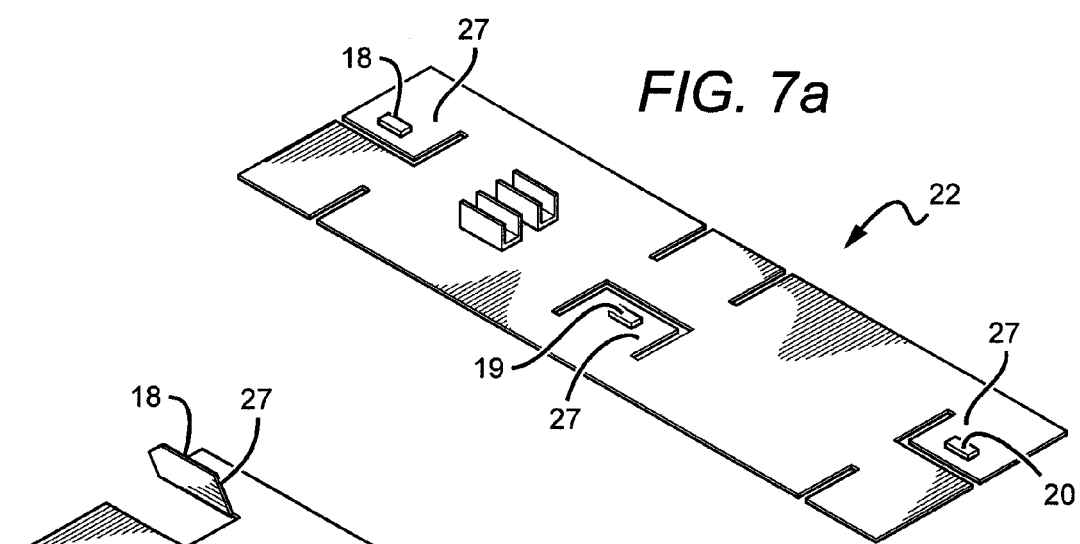
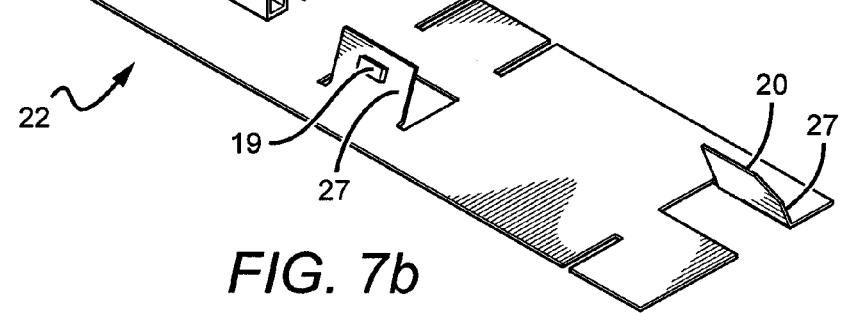
FIG. 7b

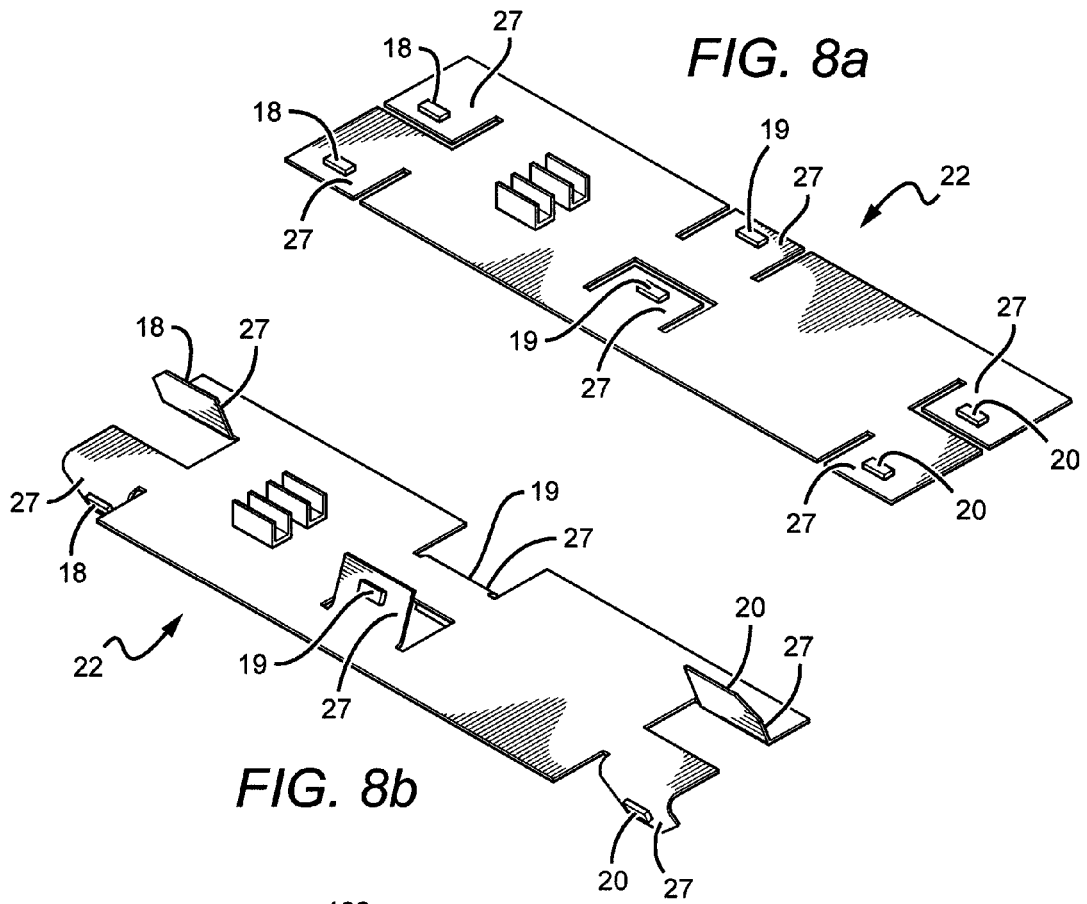
FIG. 8a
FIG. 8b
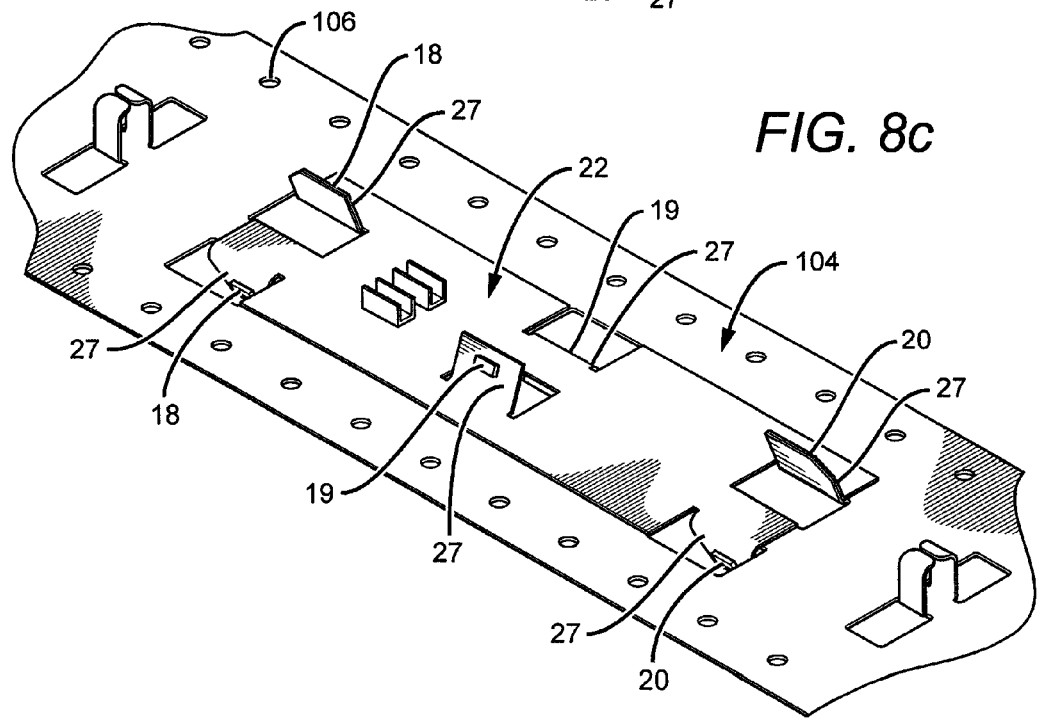
FIG. 8c

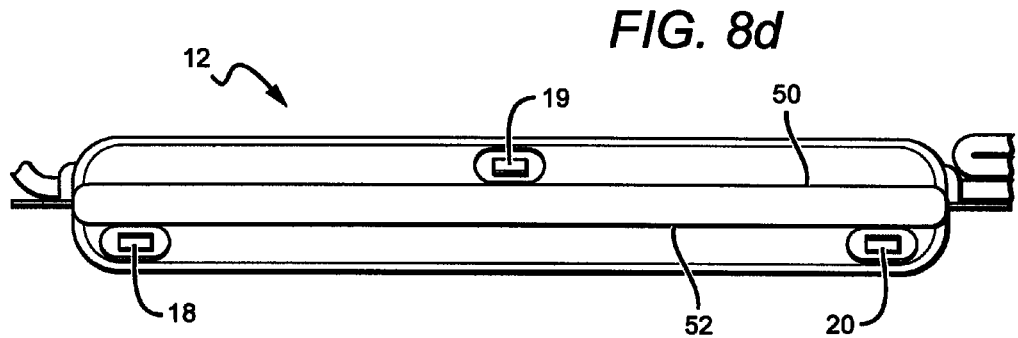
FIG. 8d
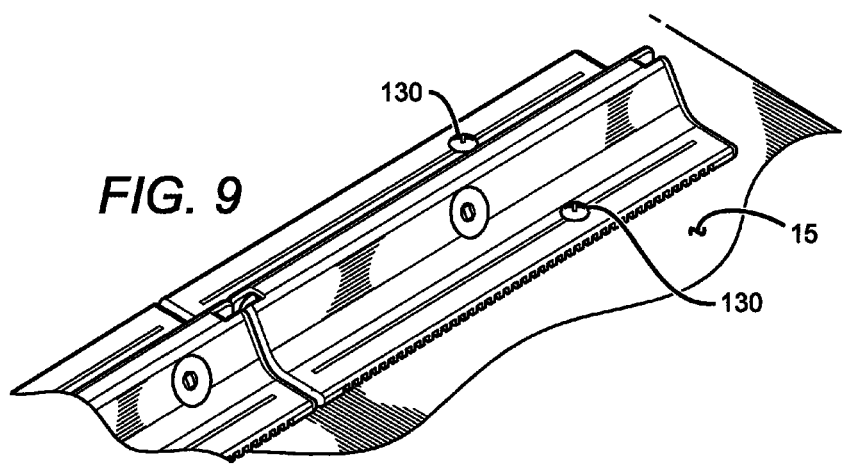
FIG. 9
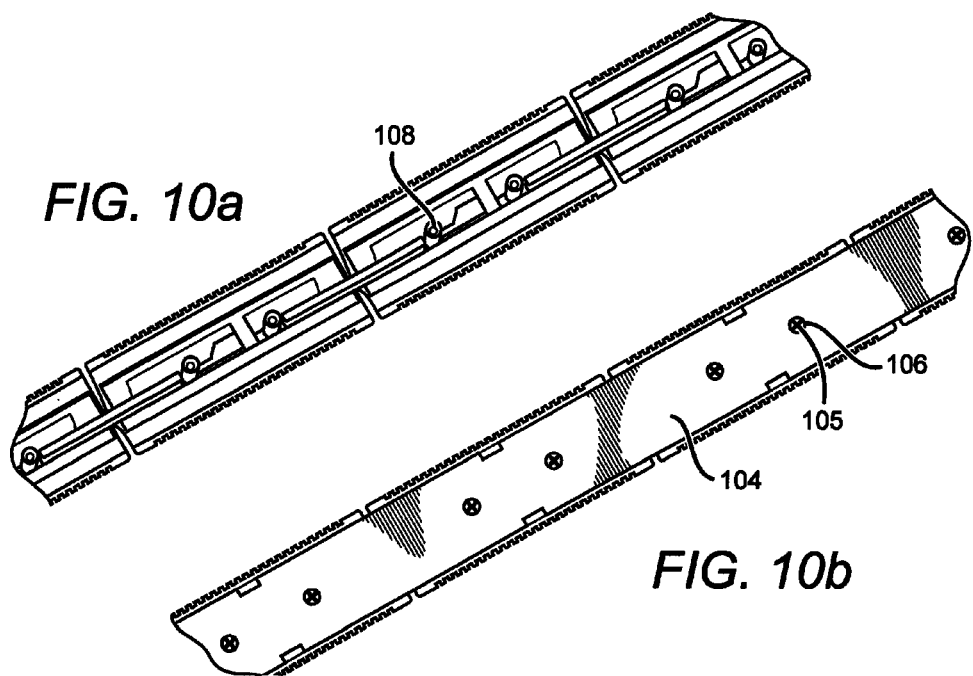
FIG. 10a
FIG. 10b

ANGLED LIGHT BOX LIGHTING SYSTEM

RELATED APPLICATIONS

This application is a continuation in part of Ser. No. 13/010,413 to Bruce Quaal et al., filed on Jan. 20, 2011, which claims the benefit of priority of provisional application Ser. No. 61/297,681, filed on Jan. 22, 2010; also a continuation in part of Ser. No. 13/010,703 to Bruce Quaal et al., filed on Jan. 20, 2011, which claims the benefit of priority of provisional application Ser. No. 61/425,713, filed on Dec. 21, 2010; also a continuation in part of Ser. No. 12/316,411 to Thomas C. Sloan, filed on Dec. 12, 2008; and claims the benefit of priority of provisional application Ser. No. 61/448,131, filed on Mar. 1, 2011. The contents of Ser. No. 13/010,413, 61/297,681, Ser. No. 13/010,703, 61/425,713, Ser. No. 12/316,411 and 61/448,131 are incorporated entirely herein by reference.

BACKGROUND OF THE INVENTION

1. Field of the Invention

This invention relates to lighting units using light sources, such as but not limited to light emitting diodes (LEDs) and more particularly to LED based lighting units for illuminating light boxes or sign cabinet lights.

2. Description of the Related Art

Display units, such as light boxes, cabinet signs and box signs are commonly found on the outside of buildings or businesses and are often used to advertise the name of the business or products. Typical units are constructed of aluminum or plastic housing having the shape of a box and are approximately 5" deep. The housing sometimes has a swing open frame to allow for easily changing the advertising graphics within. The top opening in the housing, or surface, is covered by a translucent or clear lens that transmits light from within the housing. The advertisement graphic is placed under this lens so that it is between the lens and the lighting units inside the light box. This allows the graphic to be illuminated from behind by the lighting units within the light box. In some cases the translucent lens itself may be the illuminated graphic.

Some light boxes or sign cabinets have graphics on one side and light only illuminates that side, whereas others are double-faced such that the two opposite sides of the light box each have a translucent or clear lens with a graphic and lighting inside the light box or sign cabinet illuminates both these sides and graphics.

To enhance the visibility of the advertisement within these units, different types of lighting are incorporated. Various types of lighting systems are used with different light sources such as incandescent bulbs, neon bulbs or fluorescent tubes. One of the problems associated with the conventional lighting units and systems is that their light sources can experience relatively short lifespans and they can have relatively low electrical efficiency. Incandescent bulbs, neon bulbs and fluorescent tubes have a relatively short lifespan, particularly when compared to other light sources, such as typical LEDs. These light sources are also electrically inefficient and providing sufficient lighting, especially in large lighting applications, requires the consumption of significant energy. For example, a standard fluorescent tube 60 inches in length consumes as much as 60 to 70 Watts, and conventional display units can utilize many of these tubes. Neon bulbs can also experience difficulty with cold starting, which can lead to failure of the neon bulb.

More recently, with the advent of the efficient solid state lighting sources, these display units have been used with LEDs, for example. LEDs are solid state devices that convert electric energy to light and generally comprise one or more active regions of semiconductor material interposed between oppositely doped semiconductor layers. When a bias is applied across the doped layers, holes and electrons are injected into the active region where they recombine to generate light. Light is produced in the active region and emitted from surfaces of the LED.

LEDs have certain characteristics that make them desirable for many lighting applications that were previously the realm of incandescent or fluorescent lights. Incandescent lights are very energy-inefficient light sources with a vast majority of the electricity they consume being released as heat rather than light. Fluorescent light bulbs are more energy efficient than incandescent light bulbs, but are still relatively inefficient. LEDs by contrast, can emit the same luminous flux as incandescent and fluorescent lights using a fraction of the energy.

In addition, LEDs can have a significantly longer operational lifetime. Incandescent light bulbs have relatively short lifetimes, with some having a lifetime in the range of about 750-1,000 hours. Fluorescent bulbs can also have lifetimes longer than incandescent bulbs such as in the range of approximately 10,000-20,000 hours, but provide less desirable color reproduction. In comparison, LEDs can have lifetimes between 50,000 and 70,000 hours.

The increased efficiency and extended lifetime of LEDs is attractive to many lighting suppliers and has resulted in LED lights being used in place of conventional lighting in different sign applications. For example, U.S. Pat. No. 5,697,175 to Schwartz, discloses a low power illuminated sign that is particularly adapted for use with common EXIT signs over doorways. The back of each sign comprises a reflector with a series of cavities with curved surfaces. Each cavity corresponds to a letter and background area in the sign. LEDs are mounted in the center of the cavities to illuminate the letters or background area. The LEDs are provided on a separate perpendicular circuit board or on a central projection formed in the bottom of the cavities, with light from the LEDS directed outward. The letters and background area of the sign are illuminated by light reflecting forward from the curved surfaces of the cavities, so that the only visible light is from the illumination of the cavities.

LED based light box lighting replacements are available in the marketplace. One such solution comprises a chain of LEDs within a glass tube, mimicking a fluorescent bulb structure. LED based light box lighting is also available from GE Lighting Solutions, East Cleveland, Ohio, under product name Tetra® PowerStrip and Tetra® PowerStrip DS, which comprises overmolded LED lighting modules that each have 3 LEDs. These LEDs are covered by a lens to spread the area of the light outputted. The chain of LED modules is then mounted on a rigid rail or into a rigid tube, each of which is then mounted inside a light box to hold the LEDs in place. In single sided light boxes the light modules can also be mounted directly to the back of the unit.

LED based light box lighting is also available from US LED, Houston, Tex., under product name Tandem2, which comprises pre-assembled 4-foot sections with connector clip and "L-Brackets" for installation. Each light module has several LEDs. The chains of LED modules, in 4-foot sections, are mounted on a rigid rail, each of which is then mounted inside a light box to hold the LEDs in place. In some embodiments these lighting units can be provided as multiple lighting units interconnected by conductors in a chain so that an electrical signal applied to the chain causes the lighting units to emit light. Different lengths of the chain can be utilized for a particular channel letter, with the desired length of chain being cut from the rail and mounted within the light box. Each chain is connected to each other by 24" cables. Power can then be applied to the chain causing the units to emit light. The chains are spaced approximately 9-12" apart within the light box.

Different types of chains can have different numbers of lighting units per a length, or stated differently, a different density of lighting units. These chains are typically sold at a cost per measure of length, and the cost per length is typically greater for lighting systems having higher density. To accommodate the different needs of customers for chains of different densities, many different types of lighting system chains need to be maintained and stored and made available to customers. In some light box applications it may be desirable to have different densities of units in different locations. This can require purchasing multiple chains with different densities for the same job.

Each of the lighting units in the chain also has a certain number of LEDs, such as two, four, eight, sixteen, etc., depending on the embodiment. In certain circumstances it may be desirable to have fewer than all the number of LEDs provided on the units, such as in locations where the illumination should be spread. Conventional lighting units, however, offer little flexibility in reducing the number of LEDs in certain ones or all of the LED units in a chain.

SUMMARY

The invention provides various embodiments of a lighting unit, systems and methods of manufacturing the same. The invention is configured to be efficient, reliable, cost effective and can be arranged to provide illumination for structural lighting, display lighting and ingress/egress lighting, and is particularly applicable for light boxes or sign cabinet lighting. The different embodiments comprise elements to alter or control the light distribution pattern emitted from the light sources within the lighting unit. The elements can comprise many different materials or devices arranged in different ways, with some devices comprising a plurality of electrically connected lighting units.

In one embodiment, as broadly described herein, a lighting system is disclosed that comprises a light box housing including a front surface and a back surface, a plurality of lighting units, and a mounting mechanism such that the plurality of lighting units are mounted within the light box housing. The plurality of lighting units can be interconnected in a linear array to form a row of lighting units, such that the row of lighting units is mounted to the light box housing. The light box housing can be configured such that one or more linear arrays may be mounted within the light box housing.

The lighting unit comprises a housing, a plurality of light emitting elements, a printed circuit board (PCB) within the housing wherein the plurality of light emitting elements are mounted on the PCB. The PCB and the plurality of light emitting elements can also be configured such that they are angled in relation to a plane associated with a surface of the housing. The lighting unit further comprises conductors to provide an electrical current to each of the light emitting elements. The light emitting elements are adapted to emit light in a direction away from the housing, in response to the electrical current supplied by the conductors. The lighting units can further comprise a mounting mechanism to mount the lighting units within the light box housing.

In another embodiment, the lighting unit comprises a housing, a plurality of light emitting elements mounted on a PCB within said housing and heat sinks to dissipate heat from the light emitting elements. The PCB can also be configured to conduct and dissipate heat from the light emitting elements. At least one of the plurality of light emitting elements is configured to face a direction opposite the remaining light emitting elements. The lighting unit can also be configured to be received by a mounting mechanism so as to mount the lighting unit to the light box housing or the like.

These and other aspects and advantages of the invention will become apparent from the following detailed description and the accompanying drawings which illustrate by way of example the features of the invention.

BRIEF DESCRIPTION OF THE DRAWINGS

FIG. 1 is a perspective view of a lighting system according to an embodiment of the invention;

FIG. 2a is a perspective view of the lighting system shown in FIG. 1;

FIG. 2b is a top view of the lighting system shown in FIG. 1;

FIG. 3 is a top view of the lighting system shown in FIG. 2a;

FIG. 4b is a top view of the lighting unit shown in FIG. 4a.

FIG. 5 is an exploded view of the lighting unit shown in FIG. 4a;

FIG. 6 is a perspective view of the lighting unit according to an embodiment of the invention;

FIG. 7a is a perspective view of a lighting unit according to an embodiment of the invention;

FIG. 7b is a perspective view of a lighting unit shown in FIG. 7a;

FIG. 7c is a perspective view of the lighting unit as shown in FIG. 7a;

FIG. 7d is a perspective view of the lighting unit as shown in FIG. 7a;

FIG. 8a is a perspective view of the lighting unit according to an embodiment of the invention;

FIG. 8b is a perspective view of a lighting unit shown in FIG. 8a;

FIG. 8c is a perspective view of the lighting unit as shown in FIG. 8a;

FIG. 8d is a side view of the lighting unit as shown in FIG. 8a;

FIG. 9 is a perspective view of a lighting system according to an embodiment of the invention;

FIG. 10a is a perspective view of a lighting system according to an embodiment of the invention;

FIG. 10b is an overhead view of the lighting system shown in FIG. 10a;

FIG. 11b is a perspective view of the mounting bracket shown in FIG. 11a;

FIG. 11c is a perspective view of the mounting bracket shown in FIG. 11a;

FIG. 12b is a perspective view of the mounting bracket shown in FIG. 12a;

FIG. 14b is a perspective view of the coupling device shown in FIG. 14a;

DETAILED DESCRIPTION

Figure 4A:
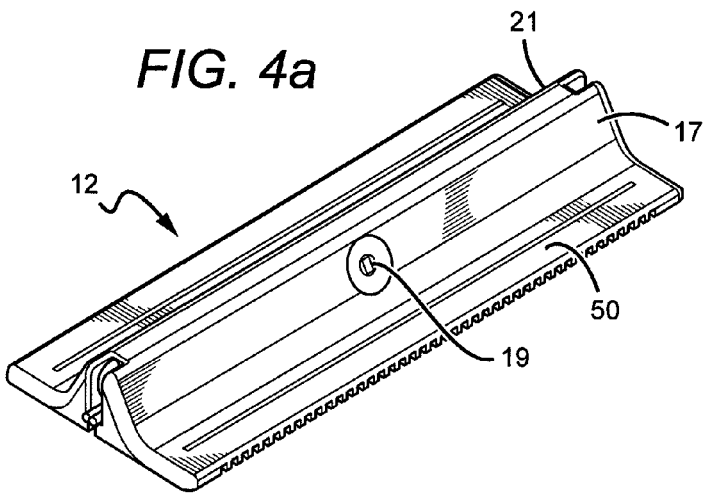
FIG. 4a is a perspective view of a lighting unit according to an embodiment of the invention.

The invention described herein is directed to different embodiments of a lighting system that can be used in many different applications such as but not limited to structural lighting, display lighting and ingress/egress lighting. The lighting system according to the invention can be arranged in many different ways with many different components, and is generally arranged to provide illumination for light boxes or sign cabinets. In some embodiments, the lighting system comprises a light box housing and plurality of lighting units, wherein the plurality of lighting units are interconnected in a daisy-chain configuration. Electrical conductors are provided to each of the plurality of lighting units so that an electrical signal applied to the input end of the conductors spreads to the lighting units, causing each of the light emitting elements to emit light. The lighting unit can be mounted in various locations within the light box housing. Each of the lighting units comprises a housing including a top side and a bottom side, and a plurality of light emitting elements mounted on a PCB, wherein the PCB is disposed within the housing. The light emitting elements are disposed within the housing in such a manner that they are on the top surface of the lighting unit, but angled away from the top surface such that they are not parallel to the top surface. In this configuration, the light emitting elements can emit at least a portion of their light to the sides of the lighting unit. In some embodiments, the light emitting elements can be placed in a cavity of the housing such that the cavity is filled with a sealant which allows for the lighting units to be customized in accordance with a particular application. For example, the lighting units may be weatherproofed or provided with additional ruggedness due to the sealant. The invention is configured to allow for the sealing or additional ruggedness to be altered meeting the needs of different applications.

These embodiments not only allow for the sealing of the lighting units to protect them from contaminants, but also allow for both the ability to style portions of the lighting units, when used in combination with an overmolded housing, and added rigidity or ruggedness provided by utilizing both the housing and the sealant.

Light boxes and sign cabinet lighting are generally known in the art and are typically used to illuminate an advertisement or signage within the light box or sign cabinet. Conventional light boxes/sign cabinets comprise a housing, a light source, electronic components to power the light source and a transparent cover. Typical light sources for these conventional light boxes/sign cabinets are, for example, incandescent, neon or fluorescent bulbs. Conventional light boxes/sign cabinets are normally mounted to a wall, suspended from a ceiling or mounted to a pole, whereas other conventional light boxes/sign cabinets can be recessed into the wall such that the electronic components are within the wall. These light boxes/sign cabinets can be big and bulky due to the physical dimensions of the necessary high power electronic components and the physical size of the light source. As such, the profile of the conventional light boxes/sign cabinets mounted to or recessed in a wall can extend from the wall such that the light box/sign cabinet is not aesthetically pleasing.

The lighting system of the invention can provide a number of additional advantages beyond those mentioned above. For example, in some embodiments the light emitting elements of the lighting units are LEDs, which are physically smaller than fluorescent and incandescent bulbs typically used in the conventional light boxes/sign cabinets, thereby reducing the profile of the lighting system. Additionally, LEDs operate at a lower power level in comparison to fluorescent and incandescent bulbs and do not need similar high power electronic components, leading to smaller electronic components, a reduction in size of the light box housing and overall weight of the lighting system.

The invention is described herein with reference to certain embodiments but it is understood that the invention can be embodied in many different forms and should not be construed as limited to the embodiments set forth herein. In particular, the invention is described with reference to certain embodiments where the light emitting elements are placed within or on a housing and filled with a sealant, but in other embodiments this configuration can be modified. In addition the lighting units may be filled and sealed using a variety of materials. The invention can also be used with different types of lighting units used in different applications beyond channel letter lighting, and although the invention is described herein with reference to light emitting diodes (LED or LEDs) other light sources can be used.

It is to be understood that when an element or component is referred to as being "on" another element or component, it can be directly on the other element or intervening elements may also be present. Furthermore, relative terms such as "between", "within", "adjacent", "below", "proximate" and similar terms, may be used herein to describe a relationship of one element or component to another. It is understood that these terms are intended to encompass different orientations of the device in addition to the orientation depicted in the figures.

Although the terms first, second, etc. may be used herein to describe various elements or components, these elements or components should not be limited by these terms. These terms are only used to distinguish one element or component from another. Thus, a first element discussed herein could be termed a second element without departing from the teachings of the present application. It is understood that actual systems or fixtures embodying the invention can be arranged in many different ways with many more features and elements beyond what is shown in the figures.

Embodiments of the invention are described herein with reference to illustrations that are schematic illustrations. As such, the actual thickness of elements and features can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. An element illustrated or described as square or rectangular will typically have rounded or curved features due to normal manufacturing tolerances. Thus, the elements illustrated in the figures are schematic in nature and their shapes are not intended to illustrate the precise shape of a feature of a device and are not intended to limit the scope of the invention.

FIGS. 1-3 show one embodiment of a lighting system 10 according to an embodiment of the invention which comprises a light box housing 11 including a front surface 13 and a back surface 15 opposite the front surface 13, and a plurality of lighting units 12 interconnected together by first and second electrical conductors 14, 16. In some embodiments, an extended length of the conductors 14, 16 can be stored in a compartment 100 located proximate an adjoining end 15 of each of the lighting units 12. This allows for varying the spacing between adjacent lighting units 12. For instance, if the spacing between adjacent lighting units 12 needs to be increased, the extended length of the first and second conductors 14, 16 can be pulled out from the compartment 100 such that the distance between adjacent lighting units 12 can be adjusted accordingly. Additionally, if adjacent lighting units 12 need to be detached, the extended length of the first and second conductors 14, 16 can be pulled out so that they can be cut. In the embodiments described, the light emission density can be decreased by increasing the spacing between different ones of the lighting units 12.

Each of the lighting units 12 has a plurality of light emitting elements. The light emitting elements may be arranged in many different ways. In one embodiment, the light emitting elements are arranged such that the light emitting elements on opposing raised surfaces of the lighting unit 12 are staggered from each of the other light emitting elements. This configuration ensures that the light emitting elements on opposite raised surfaces of the lighting unit 12 are not aligned in a back-to-back configuration, which could result in an increased light intensity in a concentrated area. The lighting units 12 may have any number of light emitting elements, but the examples shown herein have either 3 or 6 light emitting elements. First, second and third light elements 18, 19, 20 (described below) emit light out from the unit 12 in response to an electrical signal. The electrical conductors 14, 16 conduct electricity to the lighting units 12 and an electrical signal applied to the conductors 14, 16 at one end of the lighting system 10 is conducted to each of the lighting units 12 so that the light emitting elements 18, 19, 20 on each of the lighting units 12 simultaneously emit light. The lighting units 12 are particularly adapted to being mounted in the light box housing 11 or sign cabinet lighting, wherein the front surface 13 of the light box housing 11 is the light emitting surface of the lighting system 10. In some embodiments, the lighting system 10 is configured to be mounted on a wall or similar structure, such that substantially all light is emitted out the front surface 13 of the light box housing 11. In other embodiments, the lighting system 10 can be recessed mounted into a wall or similar structure, while in other embodiments the lighting system 10 can be mounted to a pole or other standalone structures.

The light box housing 11 can be configured such that the front surface 13 includes a transparent, translucent, or graphic covered cover. The front surface 13 can be formed of plastic, tempered glass or the like. In embodiments where the front surface 13 comprises a translucent or graphics covered cover, the light emitted from the light emitting elements 18, 19, 20 can be diffused by either the features of the light emitting elements 18, 19, 20 or the translucent or graphics cover, so as to give the appearance that the lighting system 10 is a continuous light source.

Figure 4B:
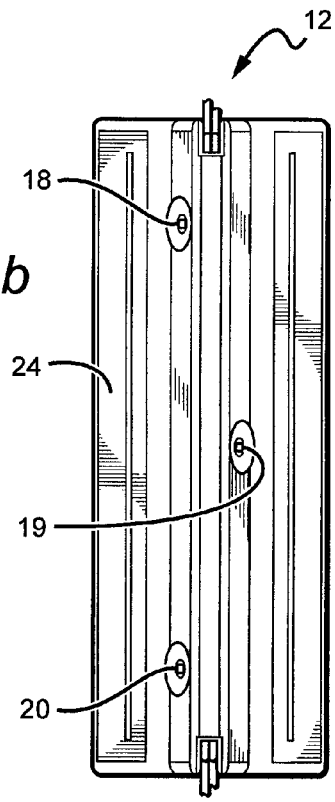

FIGS. 4a and 4b show an embodiment of the lighting units 12 according to the invention, and disclose additional components or features that may be included in the lighting system 10. For the same or similar elements or features, the same reference numbers will be used throughout the application herein. The lighting unit 12 comprises a housing 24, a plurality of light emitting elements 18, 19, 20, a PCB 22 within the housing 24, wherein the plurality of light emitting elements 18, 19, 20 are mounted on the PCB 22. In one embodiment, the PCB 22 and the light emitting elements 18, 19, 20 are disposed on angled surfaces 17, 21 of the housing 24, such that the light emitting elements 18, 19, 20 are configured to emit light in a sideways direction instead of directly towards the front surface of the light box housing 11. The PCB 22 can be made of flexible material, rigid material, or any other suitable PCB material. In yet other embodiments, more than one PCB 22 can be within the housing 24.

Figure 5:
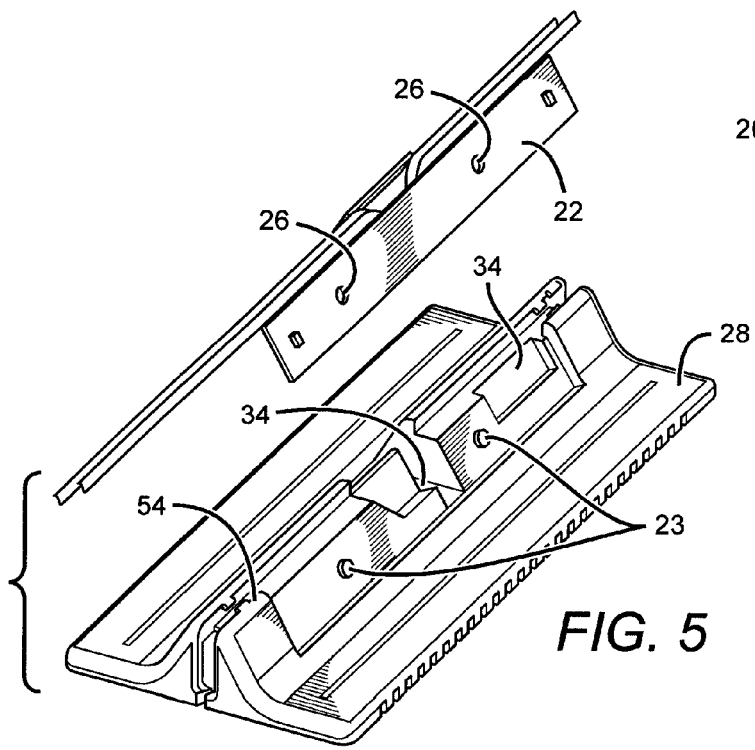

In some embodiments wherein the PCB 22 is made of a rigid material, additional wiring may be required from portions of the PCB 22 to the remainder of the PCB 22. As shown in FIG. 5, portions of the PCB 22 are arranged such that they may be bent to accommodate the angled shaped of a bottom housing portion 28 of the housing 24. In other embodiments, there can be more than one PCB 22 electrically connected to another PCB 22 such that each respective PCB 22 has at least one of the light emitting elements 18, 19, 20. As shown in FIGS. 5 and 6, the housing 24 comprises a bottom housing portion 28 that the PCB 22 can be mounted into or onto. The PCB 22 can be mounted in many ways. In some embodiments, the PCB 22 may be placed in a cavity of bottom housing 28. In other embodiments PCB 22 may be placed over a portion of bottom housing 28. In these embodiments the PCB 22 may rest on the angled surface 17, 21 of bottom housing 28 or the PCB 22 can be configured to have at least one opening 26 such that the at least one opening 26 of the PCB is received by a respective peg 23 extending from the bottom housing portion 28. The bottom housing portion 28 can be made of many conductive, semi-conductive and non-conductive materials. In one embodiment, the bottom housing portion 28 is formed of a material being plastic, such as polycarbonate, and can be made using many known processes such as by extrusion or injection molding.

The PCB 22 has first, second and third light emitting elements 18, 19 and 20 (shown in FIG. 4) disposed on a respective angled surface 17, 21 of the housing 24, and conductors 14, 16 are mounted or connected to the PCB 22. Many different connection methods can be used, with one suitable method being soldering or with the use of Insulation Displacement connectors (IDC) or Insulation Piercing connectors (IPC). The conductors 14, 16 are shown to be mounted to the opposite ends 15 of the housing 24 as lighting elements 18, 19, 20, but can be mounted and connected on either side of the PCB 22. The conductors 14, 16 electrically couple the signal on the conductors 14, 16 to their respective one of the lighting units 12. The PCB 22 can also comprises conductive traces (not shown) to conduct electrical signals from the conductors 14, 16 to the light emitting elements 18, 19, 20 so that an electrical signal applied to the first and second conductors 14, 16 is conducted to the lighting elements 18, 19, 20 through the traces, causing the elements to emit light.

The light emitting elements 18, 19, 20 are generally mounted along a longitudinal axis of the PCB 22, although they can also be mounted in other locations. In other embodiments the lighting units 12 can comprise more or less than three lighting elements, such as four, six, and eight or more, that can be mounted in many different locations. The light emitting elements 18, 19, 20 can be any device that emits light in response to an electrical signal, such as incandescent lights, lasers, laser diodes, fluorescent light, neon lights, or light emitting diodes (LEDs). The light emitting elements 18, 19, 20 can emit different colors of different intensities, with a suitable LED being commercially available emitting high luminous flux white light. One suitable LED would output 150 lumens per watt, however other LEDs have an output that is higher or lower. In some embodiments, light emitting elements may not have a lens, have lenses built in or they may be added later.

Figure 7C:
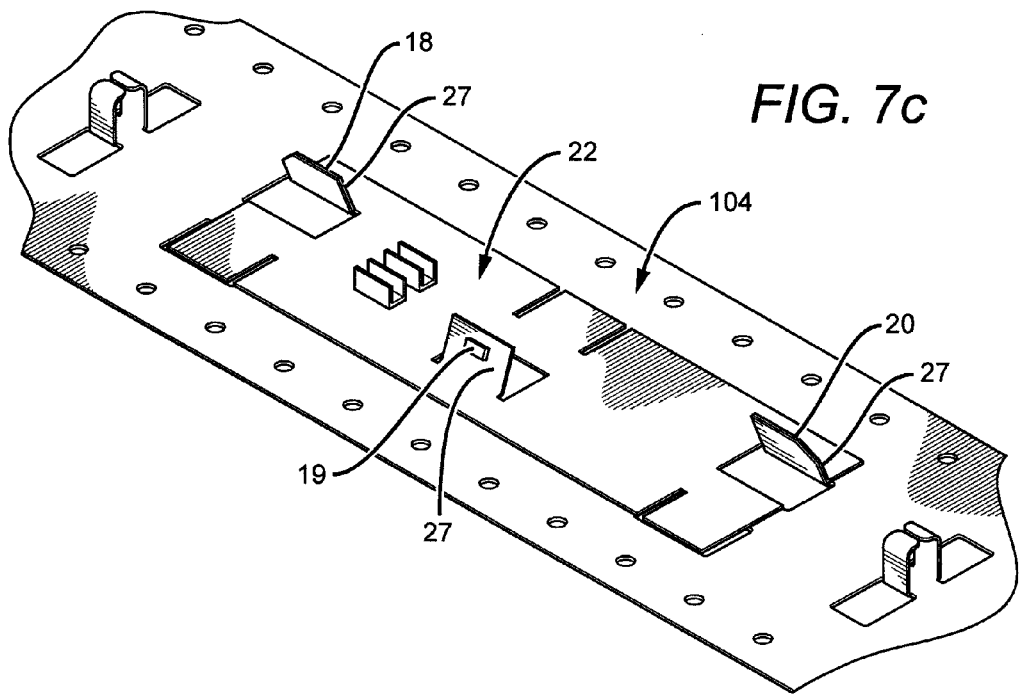
Figure 7D:
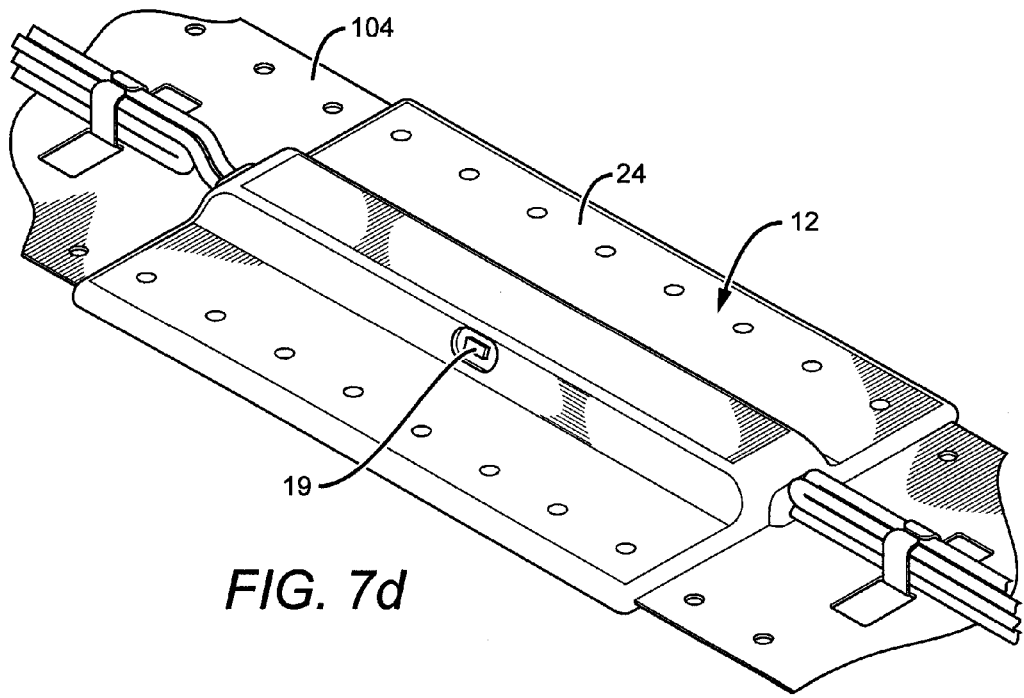

The PCB 22 can be any conventional type made from any conventional material, and in some embodiments the PCB 22 is formed of a metal core type PCB 22. In other embodiments, a flexible type PCB 22 can be used, such as a board comprised of alternating layers of polymide film and copper or any other suitable material known in the art. In embodiments wherein the PCB 22 is formed of a flexible material, portions of the PCB 22 are capable of being bent to a desired angle which corresponds to the angled surface 17, 21 of the housing 24 and remain connected to the PCB 22. As shown in FIGS. 7a-7c, the PCB 22 comprises a plurality of portions 27 wherein one of the light emitting elements 18, 19, 20 is mounted on a respective portion 27, such that the portions 27 are bent to position the light emitting elements 18, 19, 20 at a desired angle. The PCB 22 of FIGS. 7a-7c shows an embodiment wherein three light emitting elements 18, 19, 20 are used. However, the invention is not intended to be limited to such amount. In other embodiments, such as in FIGS. 8a-8c, the PCB 22 can have six light emitting elements 18, 19, 20 such that portions 27 of the PCB 22 that are adjacent each other are bent in the opposite direction to ensure that the light emitting elements 18, 19, 20 are positioned in a staggered configuration, as discussed above.

The embodiment of the lighting unit 12 shown in FIGS. 4a-4b and 7a-7c are configured to have a single-sided orientation, such that the light emitting elements 18, 19, 20 are on a top side 50 of the lighting unit 12. The embodiment of the lighting unit 12 shown in FIG. 8a-8c is configured to have a double-sided orientation, such that the light emitting elements 18, 19, 20 are on both a top side 50 and a bottom side 52 of the lighting unit 12. FIG. 8d shows a side view of the double-sided orientation. A single-sided oriented lighting unit 12 could be used in a lighting system 10, wherein the front surface 13 of the light box housing 11 is the only light emitting surface of the light box housing 11. The double-sided oriented lighting unit 12 could also be used in a similar light box housing 11 as the single-sided oriented lighting unit 12, but can also be used in a double-sided light box housing 11 wherein both the front surface 13 and the back surface 15 are configured to be light emitting surfaces. In such embodiment, both the front surface 13 and the back surface 15 can comprise either of a transparent, translucent or graphic cover.

The PCB 22 can be comprised of different types of metal core boards such as but not limited to an aluminum core board. An advantage of the PCB 22 being formed of a metal core is that heat from the light emitting elements 18, 19, 20 is conducted into the PCB 22 so that the PCB 22 helps draw away heat from the light elements 18, 19, 20. The PCB 22 then provides a larger surface area that allows the heat to dissipate into the surrounding ambient. This can help keep the light emitting elements 18, 19, 20 at a cooler temperature while in operation, which can allow the light emitting elements 18, 19, to operate under a higher current so that they can emit a higher luminous flux. Also, the light elements 18, 19, 20 may have an increased operating lifespan at a cooler operational temperature. An additional advantage of the PCB 22 being formed of a metal core is that the metal core board can be bent to form desired angles and shapes. In some embodiments, thermal vias (not shown) may be added through the PCB 22, such that the thermal vias are in thermal communication with the light emitting elements 18, 19, 20 to allow for better, more efficient heat transfer.

The light emitting elements 18, 19, 20 are angled so they do not face straight up from the top side 50 of the lighting unit 12. This angling is accomplished in a number of different ways. In one embodiment the bottom housing portion 28 can be separately fabricated from the light emitting elements 18, 19, 20 such that the angled surfaces 17, 21 are pre-set at the desired angle. The prefabricated housing 24 receives the PCB 22 and the light emitting elements 18, 19, 20 and thereby secures and maintains the positioning of the PCB 22 to rest at the desired angle. In the embodiment of FIG. 7a-7c, the plurality of portions 27 of the PCB 22 are adapted to be bent to the desired angle, wherein the PCB 22 is on a metal carrier 104 which is also adapted to be bent in a corresponding manner as the plurality of portions 27 of the PCB 22. The carrier 104 assists in maintaining the positioning of the PCB 22 at the desired angle. The carrier 104 can also be configured to have additional bent features, such as but not limited to raised wire holders that can receive conductors 14, 16. The housing 24 can then be overmolded around the carrier 104 and PCB 22. In some embodiments, a thermal hotmelt or sealant can be added to keep the PCB 22 in place (described below). The light emitting elements 18, 19, 20 are angled and arranged to disperse light evenly in a light box housing 11. Light box housings 11 have a variety of depths but they largely fall into the 5-10 inch range, on average having a depth of 8 inches. Light box housings 11 which utilize LED based lighting units 12 may have a target depth which is smaller.

The light emitting elements 18, 19, 20 are angled and may be positioned such that their light emissions overlap over the top side 50 of the lighting unit to create an even light dispersion, for a single-sided oriented lighting unit 12, whereas the light emissions of a double-sided oriented lighting unit 12 can overlap over both the top side 50 and/or the bottom side 52 of the lighting unit 12. The angle of the PCB 22 directly impacts the angle of the light emitting elements 18, 19, 20. The light emitting elements 18, 19, 20 generally have a higher output at the center of the light emitting element, but lower output to the sides of each light emitting element. When the light emitting elements 18, 19, 20 are angled, the center and highest intensity output of each light emitting element is angled off center from the lighting unit 12 itself. An advantage of this configuration of the invention is that this direction of light output travels the furthest distance to the light emitting surface of the light box housing 11 to illuminate the lighting system 10. Therefore providing a higher intensity output at these angles can provide more even light dispersion. The light dispersed directly over the lighting unit 12, is light dispersed at an angle for each of the light elements 18, 19, 20, and at a lower intensity. Light emitted directly over the lighting unit 12 travels the shortest distance to illuminate the light box housing 11 and therefore does not need to be as intense as light traveling to areas not directly over the lighting unit 12. Further, to accommodate for the lower intensity of light being emitted from the light elements 18, 19, in this direction, the light outputs of the angled light elements 18, 19, 20 are overlapped in this area to create an even light dispersion.

In one embodiment of the invention wherein the lighting unit 12 comprises three light emitting elements, at least one of the light emitting elements 18, 19, 20 is configured to face an opposite direction of the remaining light emitting elements 18, 19, 20. In some embodiments, the light emitting elements 18, 19, 20 are disposed at an angle of approximately 60-75 degrees to provide an even light dispersion. In another embodiment, the light emitting elements 18, 19, 20 can be disposed at an angle of about 45-85 degrees. In yet other embodiments, other angle placements of the light emitting elements 18, 19, 20 may be used. The lighting unit 12 may have any number of light emitting elements 18, 19, 20 and the number of light emitting elements and their distance from one another determines the angles the light emitting elements should face for optimal lighting of the lighting system 10. For example, if the light emitting elements 18, 19, 20 are further apart, a more decreased angle is desired. However, if the light emitting elements 18, 19, 20 are closer together a steeper angle would be desired. Furthermore, an additional, possibly weaker or brighter, light emitting element 18, 19, 20 may be placed on a ridge 54 of housing 24 between the other lighting elements to aid in the creation of an even light dispersion. The light emitting elements may include optics or lenses over said light emitting elements. The angles of the light emitting elements determine how far apart the rows of lighting units 12 may be from each other within the light box housing 11. In some embodiments, angles such as 50-70 degrees allows for placement of rows at 12 inches apart, similar to the current fluorescent light placement. Adjusting these angles can allow for placement of the rows of lighting units 12 at different distances while still providing an even light dispersion over the light emitting surface of the light box housing 11.

Lighting units 12 according to the present invention can also comprise other elements, with one embodiment comprising heat sinks to dissipate heat from the light elements. In another embodiment, the lighting units 12 comprise a power supply (not shown) electrically connected to conductors 14, 16. Power supplies are generally known in the art and are only discussed briefly herein. In one embodiment, the power supply is adapted to provide a constant current output. The power supply provides substantially the same drive current to the light emitting elements 18, 19, 20 so that the lighting unit 12 can emit a substantially constant light distribution pattern in accordance with the desired light emission. In some embodiments, the power supply can be installed remote to the lighting unit 12, whereas in other embodiments, the power supply can be mounted on or within the light box housing 11. At least one advantage of the invention is that the power supply, while in operation, allows the plurality of lighting units 12 to provide and maintain the desired light output and prevents the lighting system 10 from exhibiting an undesirable light output, such as but not limited to different levels of light brightness, color variations or variations in the light distribution pattern. In yet other embodiments, the lighting unit 12 can comprise constant current drive circuitry electrically connected to the power supply in order to provide the same drive current to the light emitting elements 18, 19, 20.

In one embodiment, the PCB 22 with light emitting elements 18, 19, 20 and electrically connected conductors 14, 16 can be snapped into place inside a bottom housing portion 28 (as shown in FIGS. 5 and 6). The cavities 34 within or around the bottom housing portion 28 around the light emitting elements 18, 19, 20 and the PCB 22 are filled with a sealant, which bonds to the bottom housing portion 28, PCB 22, and any other component the sealant contacts within the cavity 34. The sealant may be filled into the cavities 34 from the sides of the bottom housing portion 28 and then allowed to cure fully. It must be ensured that there are no voids or air cavities and no sealant material is deposited on the light emitter lenses. In some embodiments, this sealant may be a thermoplastic hotmelt which allows for sealing of the lighting unit 12 from contaminants. For example, an embodiment of this lighting unit using a thermoplastic hotmelt as a filler and sealant could receive an ingress protection rating such as IP68 or similar.

Bonding of the sealant 36 to components within the bottom housing portion 28 and filling of the cavities 34, also reduces strain on connections within the lighting unit 12 such as strain on the light emitting elements 18, 19, 20 connections and conductors 14, 16. The reduction of strain is a result of the sealant hardening around the components thereby reducing movement and supporting those connections.

Conventional lighting units utilizing only a plastic housing provides rigidity but not a weatherproof seal. In conventional lighting units utilizing only a sealant or thermoplastic hotmelt provides weatherproofing, but does not produce as a rigid product and the product face cannot be styled as that of one with a plastic housing. Utilizing both a bottom housing portion 28 and a sealant 36 such as the macromelt provides additional rigidity, weatherproofing, and a product face which can be stylized. This provides a product robust for installation and with a finished appearance.

Figure 16:
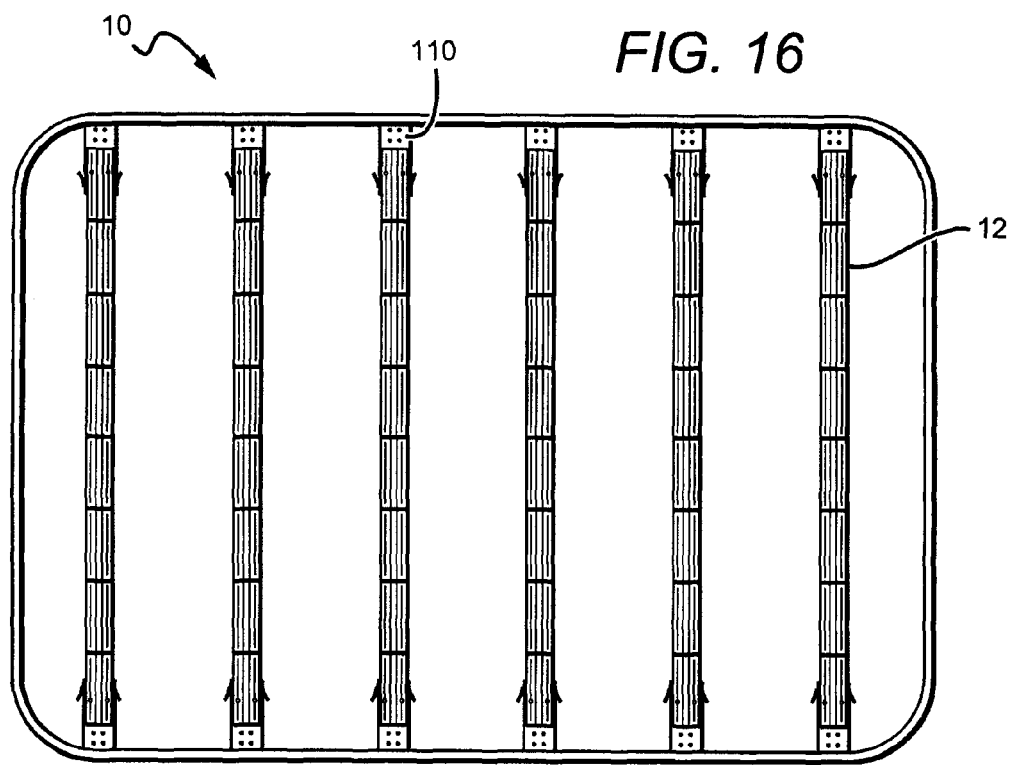
FIG. 16 is a perspective view of a lighting system according to an embodiment of the invention.

The lighting units 12 can be mounted in a linear array of a plurality of lighting units 12 within the light box housing 11, as shown in FIG. 16. Many different mounting devices 130 can be used to mount the lighting units 12 such as by glue, clamp, bolt, weld and the like. In one embodiment, the lighting units 12 can be directly mounted to the back surface 15 of the light box housing 11 by screwing a screw 130 through the bottom portion 28 of the housing 24 such that the screw secures the lighting unit 12 to the back surface 15, as shown in FIG. 9. In other embodiments the lighting units 12 can be mounted using bolts, welds, double sided tape or attached by any other suitable method. In yet other embodiments, the lighting units 12 may also be attached to a carrier 104 wherein the lighting unit 12 comprises an attachment device 108 that is aligned with a carrier opening 106 such that a nail, rivet or screw 105 can pass through the carrier opening 106 and is received by the attachment device 108 so as to secure the lighting unit 12 to the carrier 104. In other embodiments, the carrier 104 can be attached to the housing 24 by glue, clamp, bolt, weld, or double sided tape. Sealant 36 is applied in a manner, such as by blocking the area from sealant or any other suitable manner, which does not fill attachment device 108.

The carrier 104 can be rigid or flexible and made of any suitable material such as plastic or a metal such as aluminum. The carrier 104 can have a plurality of openings 106 such that a nail, rivet or screw 105 can pass through the carrier 104 and attach the carrier 104 to the light box housing 11. The lighting unit 12 can also be provided with an alternative mounting method that can be used alone or in conjunction with the double sided tape. The bottom housing portion 28 can include a housing mounting hole 42 through which a screw, nail or rivet can pass to mount the housing 24. The PCB 22 can also be configured to comprise a PCB mounting hole 43 in alignment with the housing mounting hole 42. Sealant 36 is applied in a manner, such as by blocking the area from sealant or any other suitable manner, which does not fill mounting hole so that mounting hole 42 extends through the lighting unit 12. In one embodiment, a screw can pass through a PCB mounting hole 43 and into the bottom housing portion mounting hole 42 so as to secure the lighting unit 12 and carrier 104 to the light box housing 11.

The lighting system 10 and carrier 104 may also be mounted away from the front and back surface 13, 15 of the light box housing 11 or centered within the light box housing 11 when the light box housing 11 has output surfaces on both of the front and back surfaces 13, 15. In embodiments where the lighting unit 12 is mounted away from both the front and back surfaces 13, 15 of the light box housing 11, it may be attached to the sides of the light box housing 11 by a mounting bracket 110, as shown in FIGS. 11a-12c. FIGS. 13a-13d disclose other embodiments of the invention wherein the lighting unit 12 is center mounted within the light box housing 11. Center mounting the lighting unit 12 allows the lighting unit 12 to be properly positioned to provide the necessary lighting. The embodiments shown in FIGS. 13a-13d can be installed in existing light box housings 11 as a retrofit kit unit such that the lighting unit replaces conventional light sources. An advantage of the mounting bracket 110 is that the mounting bracket 110 can be positioned over existing light bulb sockets of existing light box housings 11 which allows the positioning of the lighting unit 12 to correspond with the position of the replaced conventional light. In yet other embodiments, the mounting bracket 110 and an adjusting guide 111 can be mounted to the light box housing 11 so that the depth and positioning of the lighting unit 12 can be adjusted within the light box housing 11. This allows the positioning of the lighting unit 12 to be adjusted as desired.

Figure 11A:
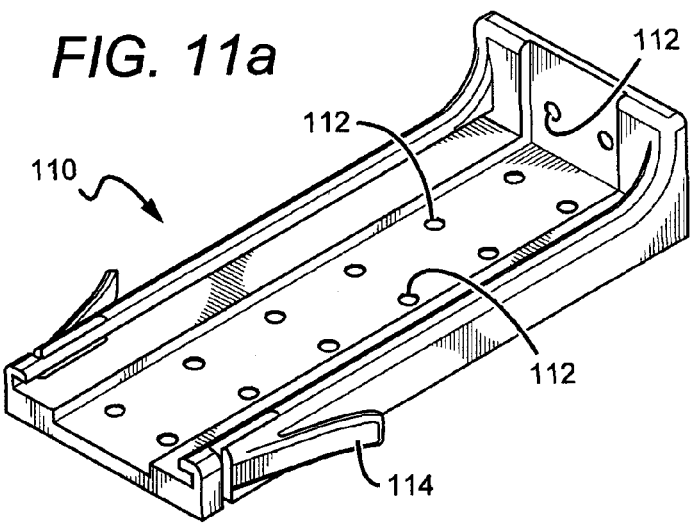
FIG. 11a is a perspective view of a mounting bracket according to an embodiment of the invention.
Figure 11B:
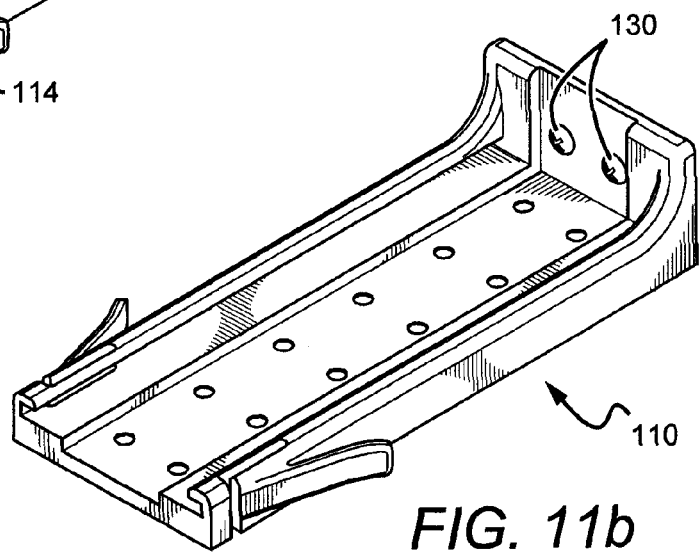
Figure 11C:
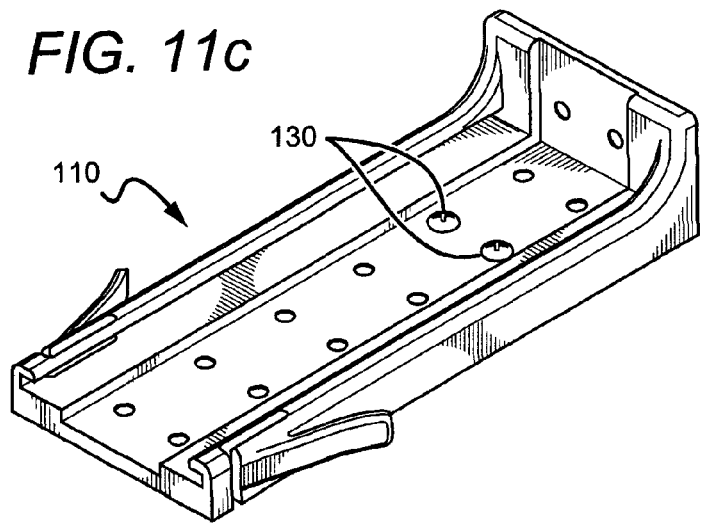
Figure 12A:
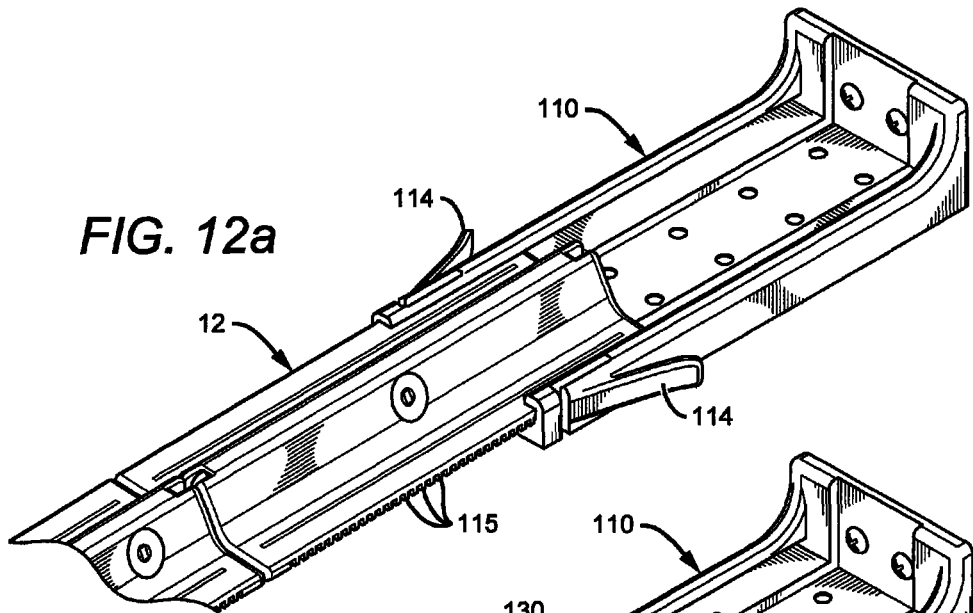
FIG. 12a is a perspective view of a mounting bracket according to an embodiment of the invention.
Figure 12B:
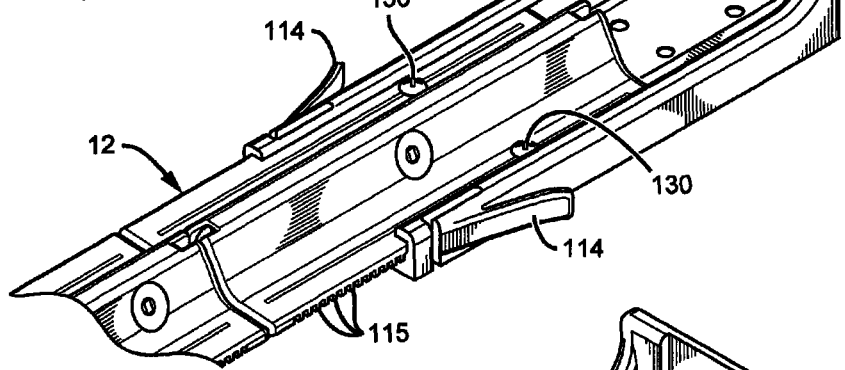
Figure 12C:
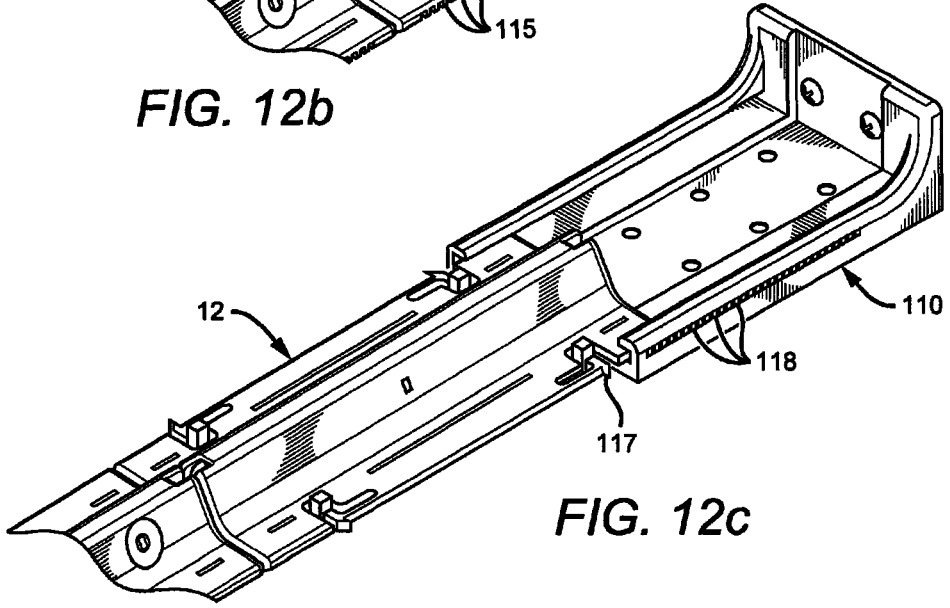
FIG. 12c is a perspective view of a mounting bracket according to an embodiment of the invention.
Figure 13A:
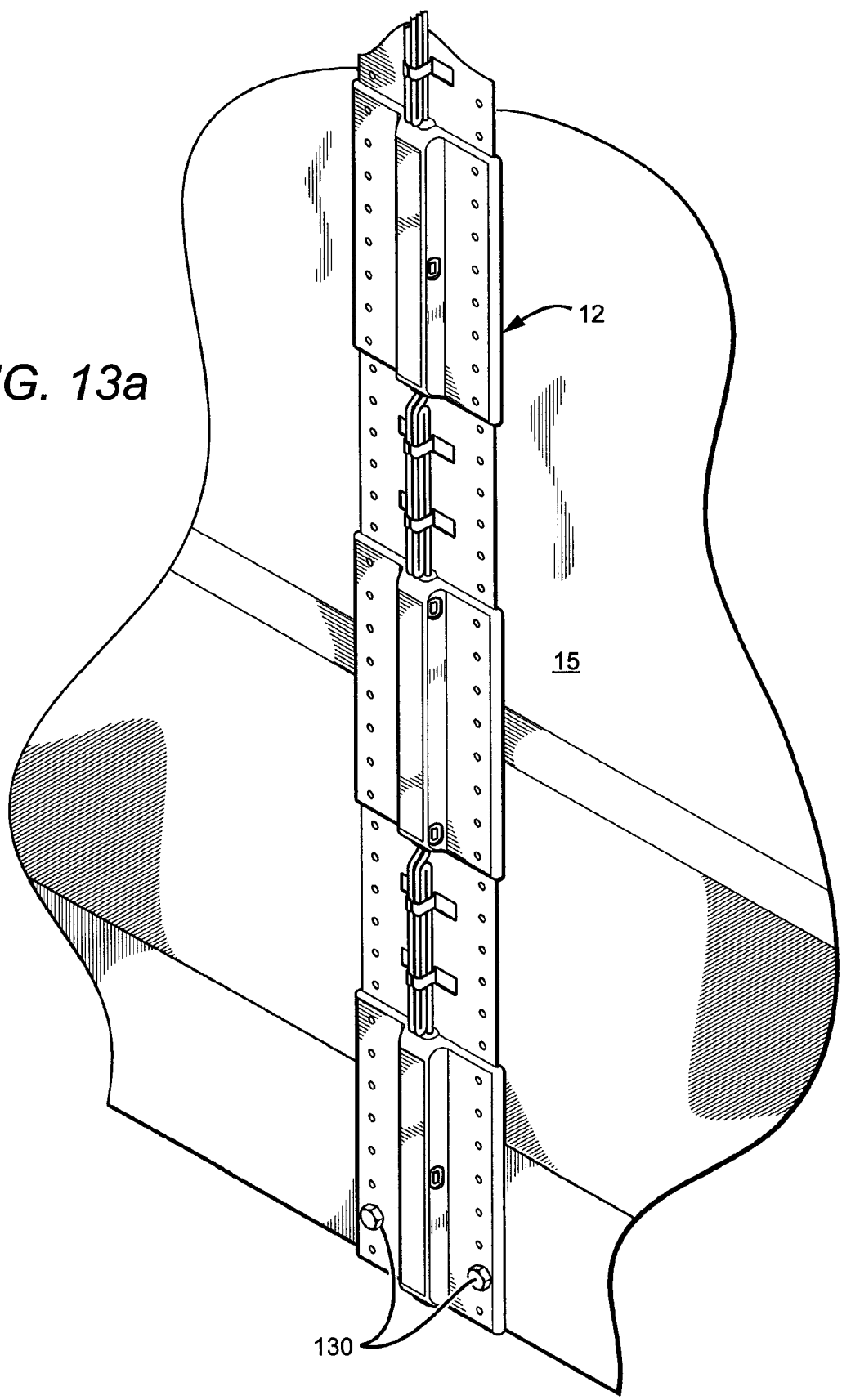
FIG. 13a is a perspective view of a lighting system according to an embodiment of the invention.
Figure 13B:
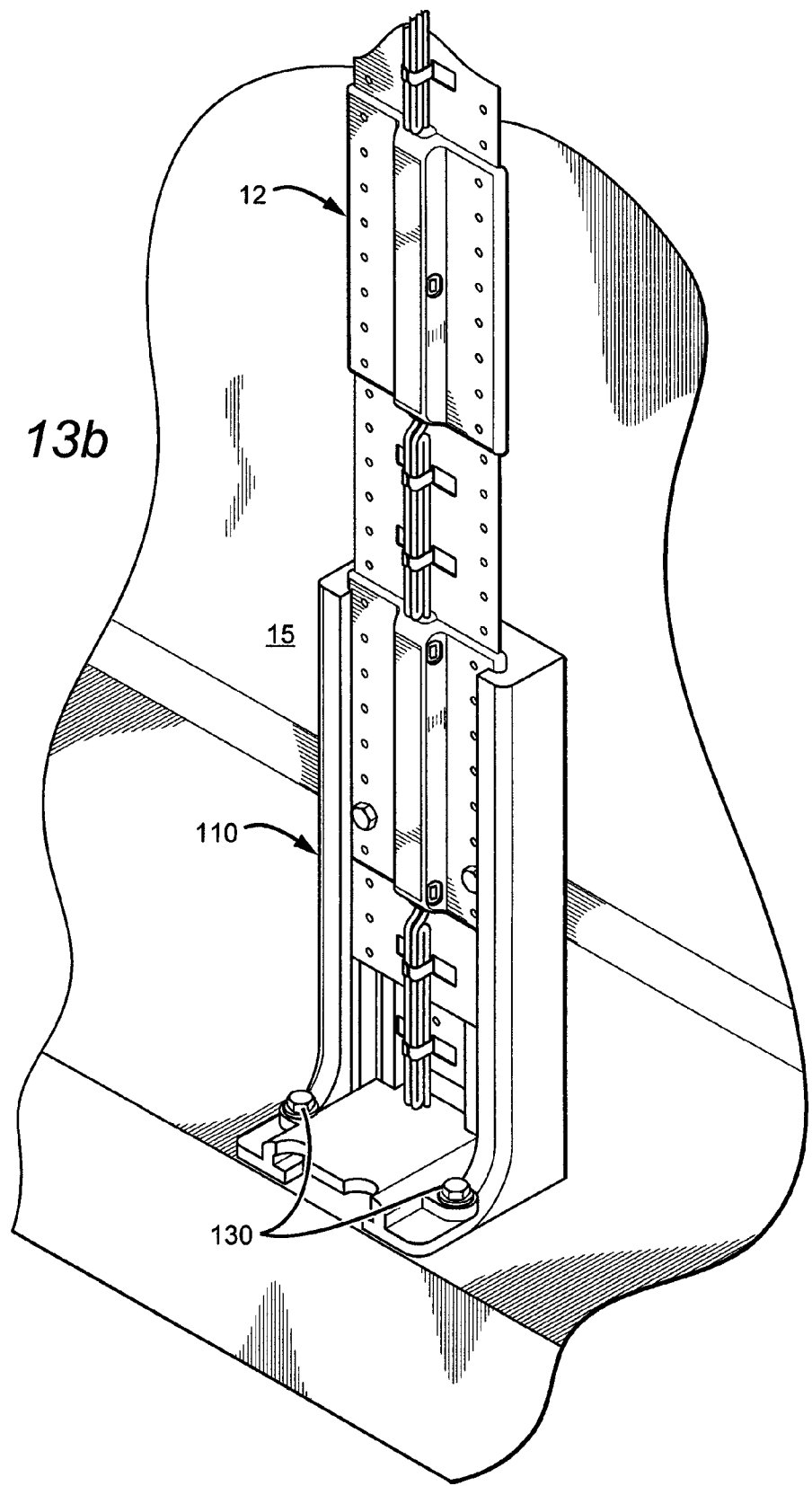
FIG. 13b is a perspective view of a lighting system according to an embodiment of the invention.
Figure 13C:
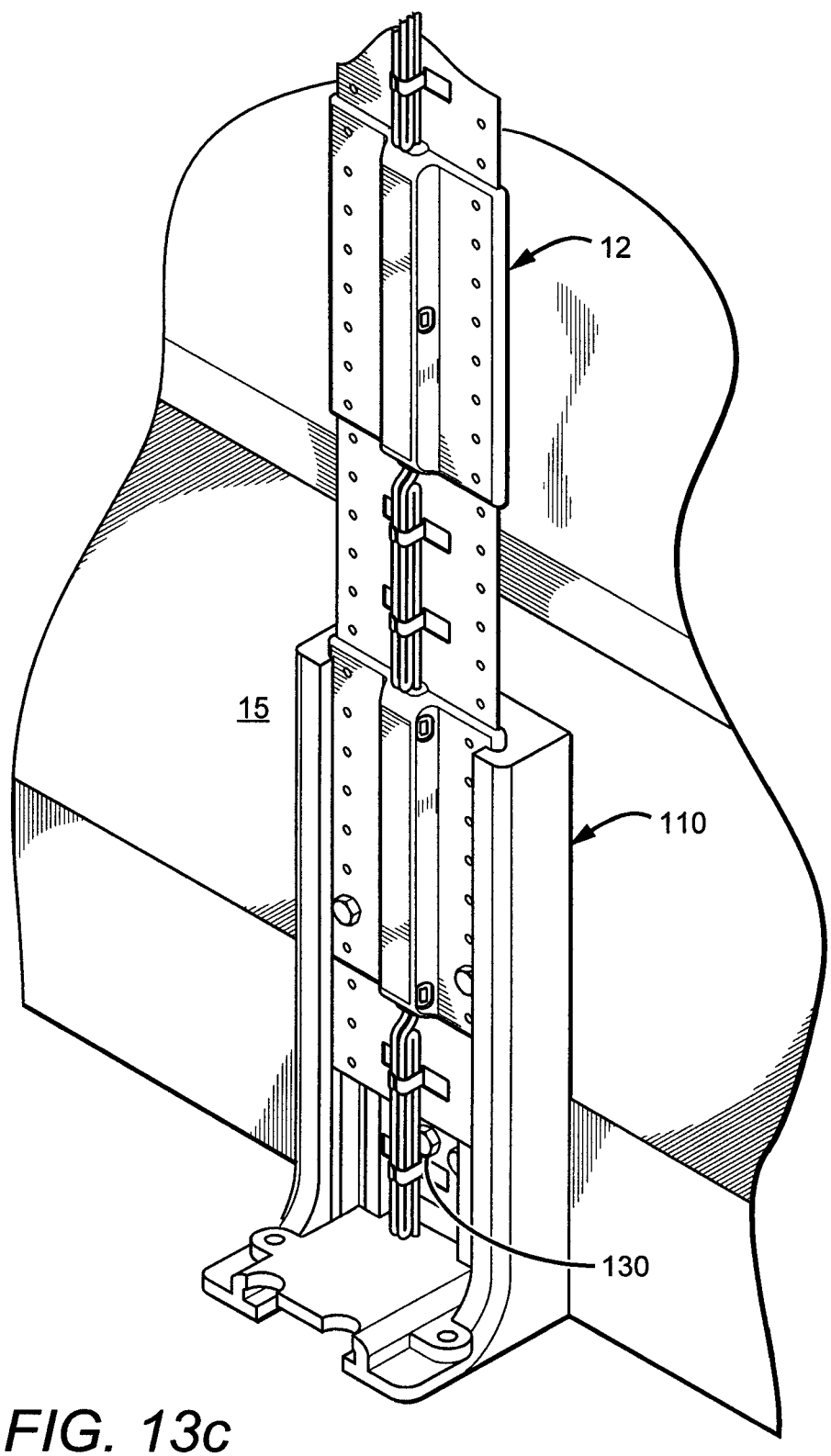
FIG. 13c is a perspective view of a lighting system according to an embodiment of the invention.
Figure 13D:
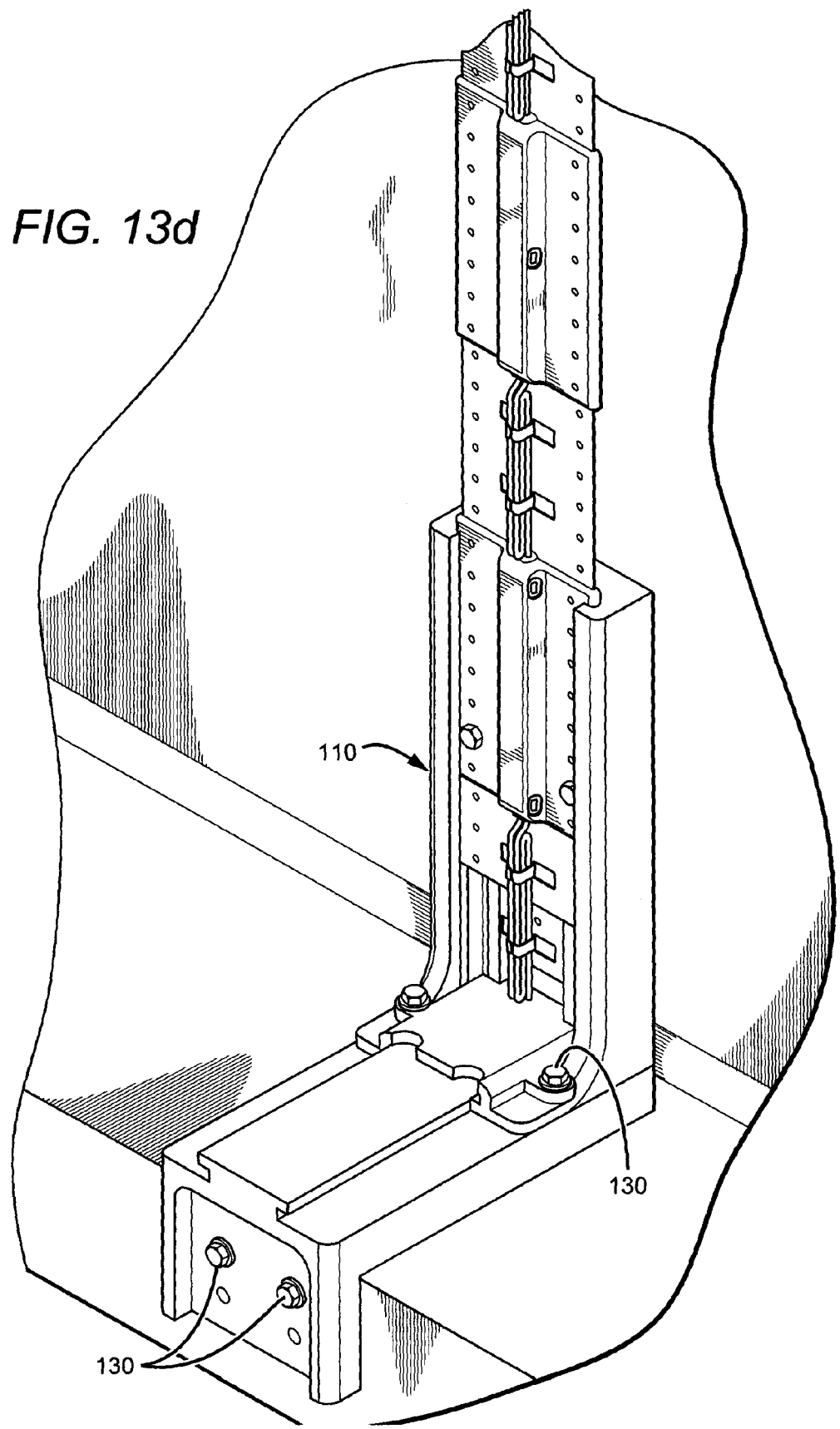
FIG. 13d is a perspective view of a lighting system according to an embodiment of the invention.

Mounting bracket 110 can be made of any suitable material including plastics or metals. In one embodiment, mounting bracket 110 can be attached by any of the above mentioned mounting methods including tape, screws, or nails through mounting holes 112. Mounting bracket 110 may be mounted to the sides of a light box housing 11 as shown in FIG. 11b or to the back surface 15 of a light box housing 11 as shown in FIG. 11c. Lighting units 12 on a carrier 104 can be attached or mounted to the mounting bracket 110 by any suitable mounting method as described above, such as by screws, tape, nails, etc. Additionally, lighting unit 12 may snap into place in bracket 110, with clips 114 of bracket 110 cooperating with a plurality of tabs 115 of the lighting unit 12 as the lighting unit 12 is received by the mounting bracket 110, in order to hold the lighting unit 12 in place, as shown in FIGS. 12a and 12b. This is but one non-limiting example of how the lighting unit 12 could be configured to be received by the mounting bracket 110 and can be configured in many different ways. For example, in another embodiment, the lighting unit 12 comprises at least one pin 117 on the bottom housing portion 28 and the mounting bracket 110 comprises a plurality of perforations 118, wherein the at least one pin 117 is received by one of the plurality of perforations 118 as the lighting unit 12 is slidably received by the mounting bracket 110, so as to secure the lighting unit 12 to the mounting bracket 110. At least one advantage of the invention is that the clips 114 are configured to disengage the tabs 115 so that the lighting unit 12 can be repositioned within the mounting bracket 110; at least one pin 117 is also configured to disengage the perforation 118 to allow the lighting unit 12 to be repositioned within the mounting bracket 110.

In double sided light box housings 11, which outputs light on both sides of the light box housing 11, 2 rows of lighting units 12 may be mounted back-to-back by any of the methods discussed above. In another embodiment wherein the double sided light box housing 11 is used, a row of double-sided oriented lighting unit 12 disclosed in FIGS. 8a-8c can be used instead of mounting 2 rows of lighting units 12 in a back-to-back configuration. The double-sided oriented lighting unit 12 can be mounted to the light box housing 11 in the similar manner as the single-sided oriented lighting unit 12 discussed herein.

Figure 14A:
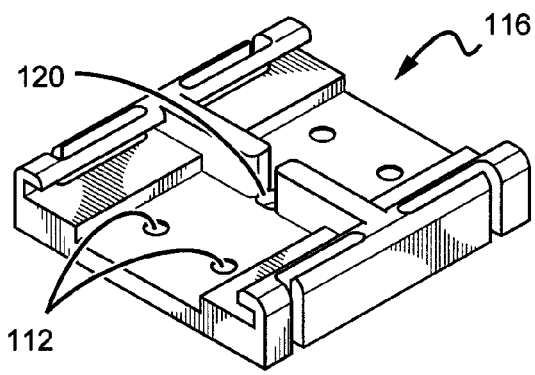
FIG. 14a is a perspective view of a coupling device according to an embodiment of the invention.
Figure 14B:
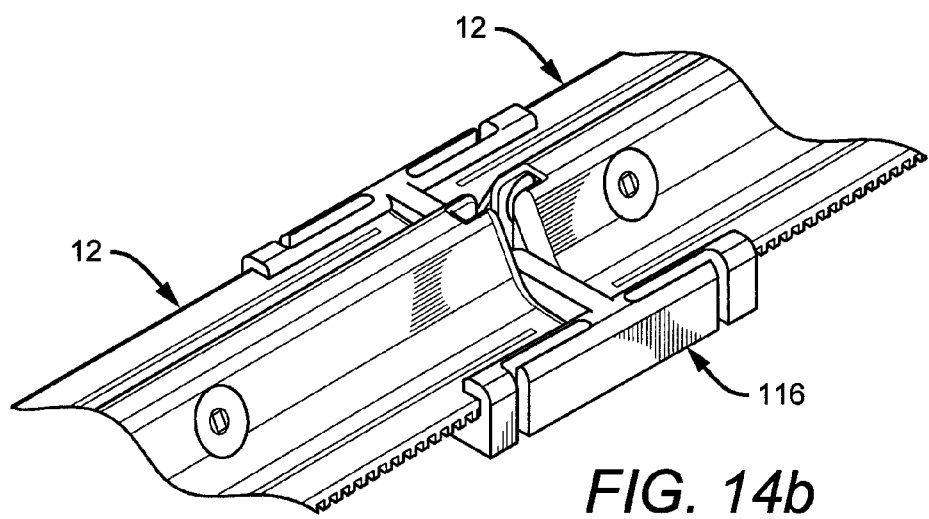
Figure 14C:
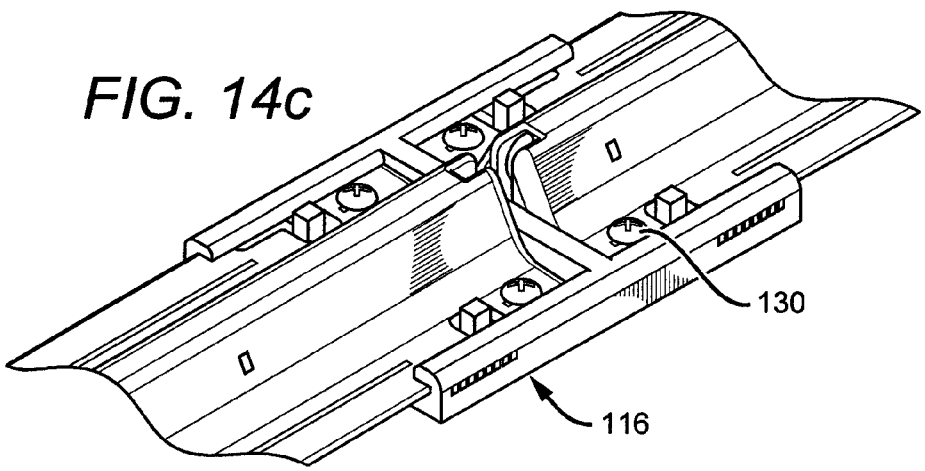
FIG. 14c is a perspective view of a coupling device according to an embodiment of the invention.
Figure 15:
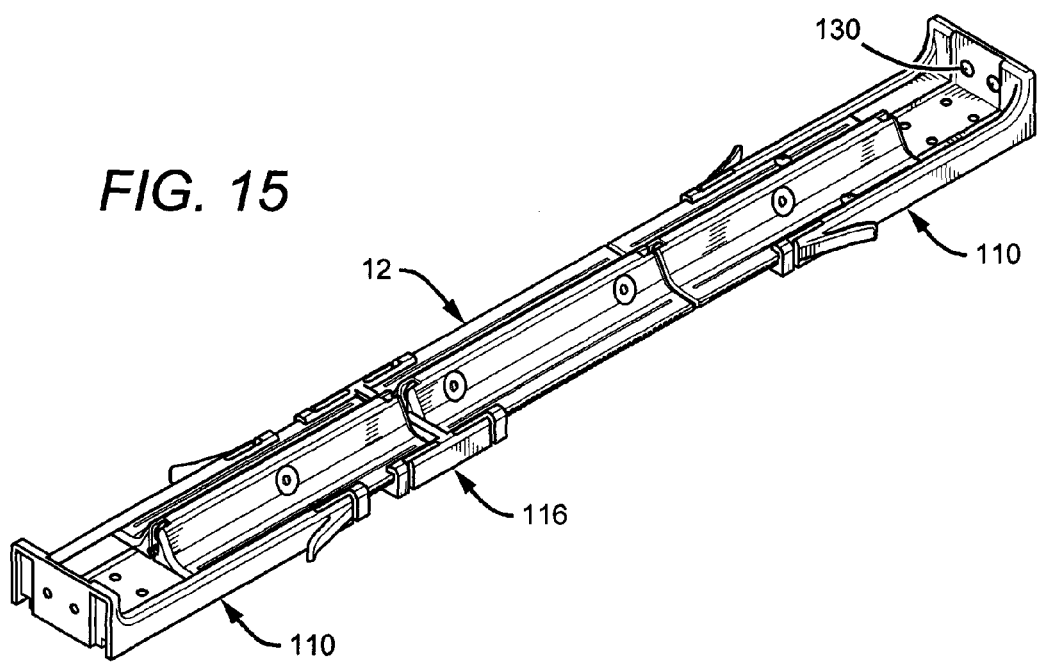
FIG. 15 is a perspective view of a lighting system according to an embodiment of the invention.

Having lighting units 12 on a carrier 104 can be advantageous since the lighting units 12 can then be stored folded or in a roll, making it easy to ship or store. Also, these long strips of lighting units 12 can be cut at any point and mounted. As shown in FIGS. 14a-14c, different strips may be attached together using the extra conductor 14, 16 wires in area 100 and with mounting coupler 116. Mounting coupler 116 may be constructed by any suitable method or material, similar to mounting bracket 110. FIG. 15 discloses an embodiment wherein lighting units 12 may be attached or mounted to mounting couplers 116 in combination with mounting bracket 110 by any suitable method such as those used for mounting to mounting bracket 110. In some embodiments, the mounting coupler 116 comprises a slot 120 which allows for conductors 14, 16 to be fed through to the back so that there is no interference with the lighting units 12.

Although the invention has been described in considerable detail with reference to certain configurations thereof, other versions are possible. Lighting units according to the invention can be many different sizes and can be used for many different applications beyond light boxes. A separate power supply can be used for each light box or row of lighting units within a light box or multiple light boxes or rows can be powered by a single power supply. In other embodiments, a variable power supply can be used to control the intensity of the light emitters. The PCB can have different numbers of LEDs and can have different electronic components arranged in different ways. The conductors can be different lengths and instead of running uninterrupted between the units, the conductors can have connectors. This would allow the power of the lighting units to be supplied separately and then connected together when installed. Therefore, the spirit and scope of the invention should not be limited to the versions described above.

We claim:

1. A lighting system, comprising:
a system housing including a front surface and a back surface;
a plurality of lighting units in said system housing, and comprising conductors to provide an electrical signal to each of said units, each of said plurality of lighting units comprising:
a housing;
a plurality of light emitting elements;
at least one printed circuit board (PCB) within said housing, wherein said plurality of light emitting elements are mounted on said at least one PCB, said plurality of light emitting elements arranged such that they are angled in relation to a plane associated with a surface of said housing, wherein said housing is an overmolded housing;
said plurality of light emitting elements adapted to emit light substantially away from said housing in response to an electrical signal; and
at least one of said plurality of light emitting elements facing a direction different than at least one of the remaining light emitting elements.

2. The system of claim 1, wherein said at least one PCB adapted to conduct and dissipate heat from said light emitting elements.

3. The system of claim 2, wherein said at least one PCB comprises a metal core PCB arranged to conduct heat away from said light emitting elements.

4. The system of claim 1, wherein at least one of said light emitting elements comprises a light emitting diode.

5. The system of claim 1, wherein at least one of said light emitting elements comprises a high luminous flux light emitting diode emitting white light.

6. The system of claim 1, wherein each of said units further comprises a constant current device adapted to provide substantially the same current to each of said plurality of light emitting elements.

7. The system of claim 1, wherein said conductors comprise two conductors, each of said units electrically connected to said conductors.

8. The system of claim 7, wherein said units electrically connect to said conductors by soldering.

9. The system of claim 7, wherein said conductors are electrically connected to said at least one PCB of said units.

10. The system of claim 1, wherein said housing only partially encloses each of said units.

11. The system of claim 1, further comprising:
drive electronics for said light emitting elements on said at least one PCB of at least one of said plurality of lighting units; and
said housing of said at least one of said plurality of lighting units comprising a protective bridge passing over the top of said electronics.

12. The system of claim 1, further comprising a mounting mechanism for mounting said units to said system housing.

13. The system of claim 1, wherein at least one of said units comprises a mounting hole extending through said housing and wherein said mounting mechanism comprises a screw to cooperate with said mounting hole.

14. The system of claim 13, wherein said at least one PCB comprises a PCB mounting hole aligned with said mounting hole of said units, such that said screw extends through said housing and said at least one PCB.

15. A lighting system, comprising:
a system housing including a front surface and a back surface;
a plurality of lighting units in said system housing, and comprising conductors to provide an electrical signal to each of said units, each of said plurality of lighting units comprising:
a housing;
a plurality of light emitting elements;
at least one printed circuit board (PCB) within said housing, wherein said plurality of light emitting elements are mounted on said at least one PCB, said plurality of light emitting elements arranged such that they are angled in relation to a plane associated with a surface of said housing; and
said plurality of light emitting elements adapted to emit light substantially away from said housing in response to an electrical signal;
at least one of said plurality of light emitting elements facing a direction different than at least one of the remaining light emitting elements;
wherein said housing only partially encloses each of said units; and
a sealant within said housing filling cavities proximate said light emitting elements and said at least one PCB.

16. The system of claim 15, wherein said sealant encloses said units not enclosed by said housing.

17. A lighting unit, comprising:
a housing;
at least one printed circuit board (PCB) within said housing;
a plurality of light emitting elements arranged on said at least one PCB, said light emitting elements adapted to emit light substantially away from said housing, wherein each light emitting elements has a respective light distribution pattern such that said light distribution of adjacent light emitting elements overlap to form a uniform light emission through a translucent material or onto a surface;
wherein said at least one PCB is configured such that at least one of said light emitting elements is on an angled surface, wherein said at least one PCB is arranged to be bent to form said angled surface.

18. The lighting unit of claim 17, wherein said at least one PCB further comprises a conductive core, said at least one PCB adapted to conduct heat from said light emitting elements.

19. The lighting unit of claim 17, wherein said at least one PCB is formed of rigid material or flexible material.

20. The lighting unit of claim 17, further comprising a carrier, wherein said at least one PCB is on said carrier.

21. The lighting unit of claim 20, wherein said carrier maintains the positioning of said angled surface.

22. A lighting unit, comprising:
a housing;
at least one printed circuit board (PCB) within said housing;
a plurality of light emitting elements arranged on said at least one PCB, said light emitting elements adapted to emit light substantially away from said housing, wherein each light emitting elements has a respective light distribution pattern such that said light distribution of adjacent light emitting elements overlap to form a uniform light emission through a translucent material or onto a surface;
wherein said at least one PCB is configured such that at least one of said light emitting elements is on an angled surface, wherein said housing is an overmolded housing.

23. A lighting unit, comprising:
a housing;
at least one printed circuit board (PCB) within said housing;
a plurality of light emitting elements arranged on said at least one PCB, said light emitting elements adapted to emit light substantially away from said housing, wherein each light emitting elements has a respective light distribution pattern such that said light distribution of adjacent light emitting elements overlap to form a uniform light emission through a translucent material or onto a surface;
wherein said at least one PCB is configured such that at least one of said light emitting elements is on an angled surface;
wherein said at least one PCB is formed of rigid material or flexible material, wherein a flexible PCB comprises a plurality of portions adapted to be bent so as to form said angled surface.

24. The lighting unit of claim 20, wherein said lighting unit is configured to be a single-sided light emitting device.

25. The lighting unit of claim 20, wherein said lighting unit is configured to be a double-sided light emitting device.

26. The lighting unit of claim 25, wherein said plurality of portions are bent such that at least one portion is facing a direction different than at least one the other remaining portions, wherein each of said plurality of portions has a respective one or more of said light emitting elements, such that light emission occurs from a top side and a back side of said housing.

27. A lighting unit, comprising:
a housing;
at least one printed circuit board (PCB) within said housing;
a plurality of light emitting elements arranged on said at least one PCB, said light emitting elements adapted to emit light substantially away from said housing, wherein each light emitting elements has a respective light distribution pattern such that said light distribution of adjacent light emitting elements overlap to form a uniform light emission through a translucent material or onto a surface;

wherein said at least one PCB is configured such that at least one of said light emitting elements is on an angled surface; and
a sealant to fill cavities proximate said at least one PCB and said light emitting elements.

28. The lighting unit of claim 27, wherein said sealant bonds to said housing and said at least one PCB, strengthening connections between components therein.

29. The unit of claim 27, wherein said sealant is a thermoplastic hotmelt.

30. A cabinet lighting system, comprising:
a cabinet housing;
a translucent cabinet cover;
a plurality of lighting units mounted to said cabinet housing;
conductors adapted to provide an electrical signal to each of said units, wherein each of said plurality of lighting units comprises:
a lighting unit housing; and
at least one printed circuit board (PCB) mounted within said lighting unit housing and having a plurality of light emitting elements, said light emitting elements configured to emit light substantially away from said lighting unit housing, said at least one PCB in thermal communication with said light emitting elements so as to dissipate heat.

31. The system of claim 30, further comprising a sealant filling the surrounding area of said at least one PCB within said lighting unit housing, said sealant also filling all other cavities or voids within said lighting unit housing without covering said light emitting elements.

32. The system of claim 30, further comprising a mounting mechanism for mounting said unit to said channel letter housing.

33. The system of claim 30, wherein said housing in at least one of said units comprises a hole, said at least one PCB also comprising a hole, said hole extending through said sealant, and wherein said mounting mechanism comprises a screw to cooperate with said hole.

34. The system of claim 30, wherein said translucent cover disperses light from said lighting units giving that the appearance that said channel letter is illuminated by a continuous light source.

35. A lighting system, comprising:
a system housing including a front surface and a back surface;
an array of lighting units mounted within said system housing, each of said lighting units comprising:
a lighting unit housing;
at least one printed circuit board (PCB) within said lighting unit housing;
at least one light emitting element on said at least one PCB, said at least one light emitting element arranged on an angled surface, wherein said at least one PCB is arranged to be bent to form said angled surface;
first and second conductors electrically connected to said at least one light emitting element and adapted to provide an electrical signal to said at least one light emitting element.

36. The lighting system of claim 35, wherein said lighting unit housing is shaped to form said angled surface.

37. The lighting system of claim 36, wherein said lighting unit housing comprises a plurality of said angled surfaces.

38. The lighting system of claim 35, wherein said at least one PCB adapted to conduct and dissipate heat from said light emitting elements.

39. The lighting system of claim 35, further comprising a mounting bracket adapted to receive said array of lighting units and mount said array of lighting units to said system housing, wherein said array of lighting units is mounted on a carrier.

40. The lighting system of claim 39, said mounting bracket comprising a plurality of clips, wherein each of said lighting units comprise a plurality of tabs such that each of said plurality of clips cooperate with and receive said tabs to secure said lighting unit to said mounting bracket.

41. The lighting system of claim 39, said mounting bracket comprising a plurality of mounting holes so as to mount said mounting bracket to said system housing.

42. The lighting system of claim 39, wherein said carrier is made of flexible or rigid material.

43. The lighting system of claim 35, wherein said array is a single-sided light array.

44. The lighting system of claim 35, wherein said array is arranged as a double-sided light array.

45. A lighting system, comprising:
a system housing including a front surface and a back surface;
an array of lighting units arranged in a daisy-chain configuration within said system housing, each of said lighting units comprising:
a lighting unit housing, said lighting unit housing having a top portion and a bottom portion, wherein one of said portions is arranged to have at least one angled surface, wherein said lighting unit housing is an overmolded housing;
at least one light emitting element on a printed circuit board (PCB), said PCB disposed on said at least one angled surface of one of said portions;
first and second conductors electrically connected to said at least one light emitting element and adapted to provide an electrical signal to said at least one light emitting element.

46. The lighting system of claim 45, wherein said lighting unit comprises a plurality of light emitting elements, said plurality of light emitting elements arranged in a staggered configuration.

47. The lighting system of claim 45, wherein each of said plurality of light emitting elements are arranged to face a different direction than an adjacent one of said plurality of light emitting elements.

48. The lighting system of claim 45, further comprising a mounting bracket adapted to slidably receive said array of lighting units and mount said array of lighting units to said system housing, wherein said array of lighting units is mounted on a carrier.

49. The lighting system of claim 45, wherein an extended length of said first and second conductors is housed between an adjoining end of said lighting unit housing of each of said lighting units.

50. The lighting system of claim 49, wherein said mounting bracket comprises a plurality of clips, wherein each of said lighting units comprise a plurality of tabs such that each of said plurality of clips cooperate with and receive said tabs to secure said lighting unit to said mounting bracket.

51. The lighting system of claim 49, said mounting bracket comprising a plurality of mounting holes so as to mount said mounting bracket to said system housing.

52. The lighting system of claim 45, wherein said array is a single-sided light array.

53. The lighting system of claim 45, wherein said array is arranged as a double-sided light array.

54. A lighting system, comprising:
a system housing including a front surface and a back surface;
an array of electrically connected lighting units on a carrier and mounted within said system housing, each of said lighting units comprising:
- a printed circuit board (PCB) on said carrier, said PCB comprising a plurality of portions adapted to be bent to a desired angle;
- a plurality of light emitting elements, wherein one or more of said plurality of light emitting elements is on a respective one of said plurality of portions such that each of said plurality of light emitting elements is positioned at said desired angle;
- first and second conductors adapted to provide an electrical signal to said plurality of light emitting elements;
- a housing covering at least part of at least one of said PCB or said carrier.

55. The lighting system of claim 54, said carrier configured to receive and store additional first and second conductors between adjacent lighting units of said array.

56. The lighting system of claim 54, said carrier comprising a plurality of mounting holes, wherein said carrier and array of lighting units can be mounted to said system housing.

57. The lighting system of claim 54, wherein said carrier is adapted to be bent to correspond with each of said plurality of portions of said PCB, such that said carrier assists in maintaining said desired angle.

58. The lighting system of claim 54, wherein said array is a single-sided light array.

59. The lighting system of claim 54, wherein said array is arranged as a double-sided light array.

60. A lighting system comprising:
a system housing including a front surface and a back surface;
an array of lighting units on a carrier mounted within said system housing; and
at least one mounting bracket mounted to said system housing and configured to receive said array of lighting units on said carrier, such that said at least one mounting bracket mounts said array of lighting units on said carrier within said system housing.

61. The lighting system of claim 60, wherein said at least one mounting bracket is configured to be adjustable, such that positioning of said array within said system housing can be varied.

62. The lighting system of claim 61, wherein said at least one mounting bracket is arranged to mount said array to said back surface of said system housing.

63. The lighting system of claim 61, wherein said mounting bracket is arranged to mount said array between said front and back surfaces of said system housing.

64. The lighting system of claim 60, further comprising:
said at least one mounting bracket comprising at least one clip; and
at least one lighting unit of said array of lighting units comprising a plurality of tabs, such that said plurality of tabs are engaged by said at least one clip to mount said array of lighting units to said at least one mounting bracket.

65. The lighting system of claim 60, wherein said carrier comprises a plurality of holes and said at least one mounting bracket comprises a plurality of holes, such that said plurality of holes of both of said carrier and at least one mounting bracket are aligned to receive a mounting device in order to mount said array to said at least one mounting bracket.

* * * * *